(12) United States Patent
Kubo et al.

(10) Patent No.: US 6,396,747 B2
(45) Date of Patent: *May 28, 2002

(54) SEMICONDUCTOR MEMORY DEVICE CAPABLE OF HIGH SPEED INPUT/OUTPUT OF WIDE BANDWIDTH DATA BY IMPROVING USAGE EFFICIENCY OF EXTERNAL DATA BUS

(75) Inventors: Takashi Kubo; Hisashi Iwamoto, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,093

(22) Filed: Dec. 14, 1999

(30) Foreign Application Priority Data

Apr. 16, 1999 (JP) ............................................. 11-109709

(51) Int. Cl.⁷ ................................................. G11C 7/00
(52) U.S. Cl. .................................. 365/189.05; 365/236
(58) Field of Search ........................... 365/189.05, 233, 365/221, 236

(56) References Cited

U.S. PATENT DOCUMENTS

| | | | | |
|---|---|---|---|---|
| 5,375,089 A | * | 12/1994 | Lo | 365/189.04 |
| 5,515,325 A | | 5/1996 | Wada | 365/189.01 |
| 5,640,361 A | * | 6/1997 | Hessel | 365/233 |
| 5,844,858 A | * | 12/1998 | Kyung | 365/233 |

FOREIGN PATENT DOCUMENTS

| | | |
|---|---|---|
| JP | 8-129890 | 5/1996 |
| JP | 10-172283 | 6/1998 |

\* cited by examiner

*Primary Examiner*—A. Zarabian
(74) *Attorney, Agent, or Firm*—McDermott, Will & Emery

(57) ABSTRACT

Serial write data of the burst length transmitted to a data bus are stored in parallel in latch circuits by a S/P data conversion circuit. In a memory cell array, one row of memory cells and four columns of memory cells are rendered active at the same time. Respective bit lines and latch circuits are connected by a sense amplifier I/O circuit. The write data of the burst length are written into the memory cell array at one time. The data of the bit length read out at one time from the memory cell array are converted into serial data by a P/S data conversion circuit to be transmitted to the data bus.

37 Claims, 16 Drawing Sheets

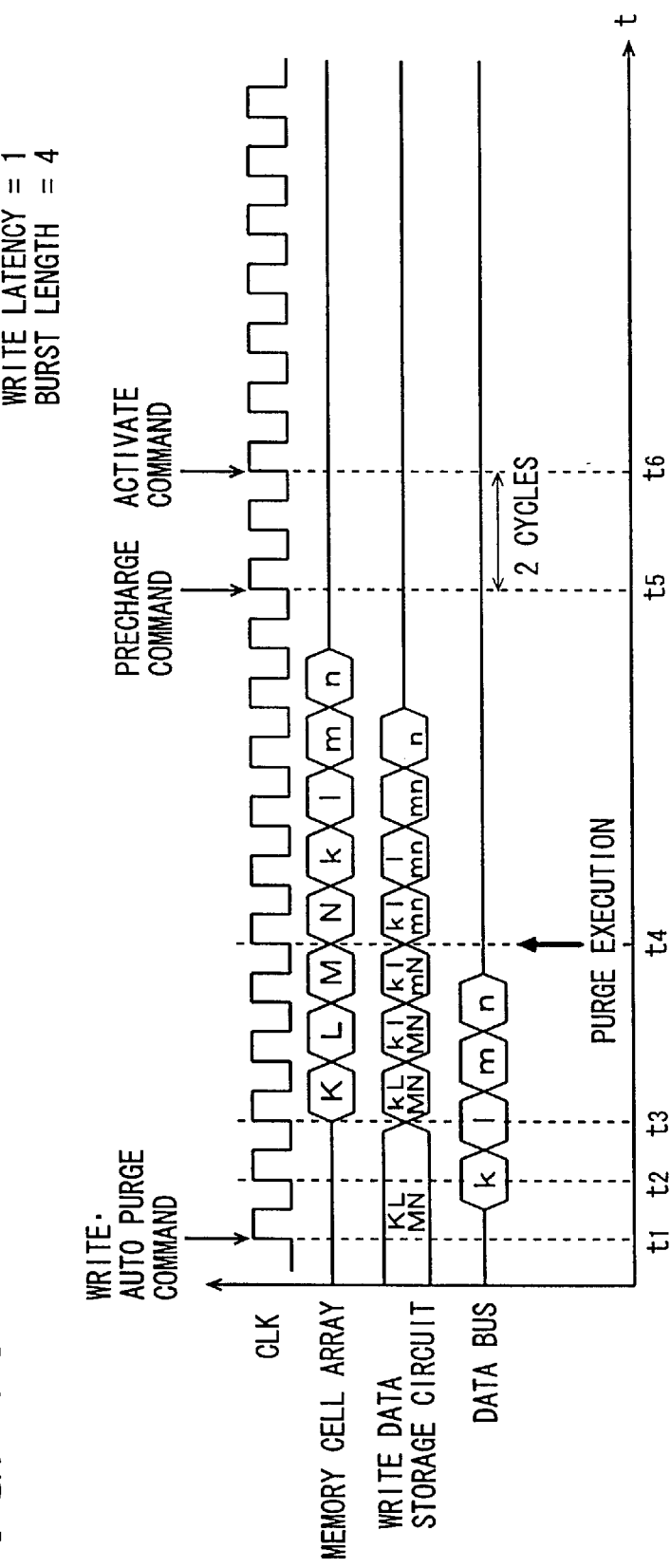

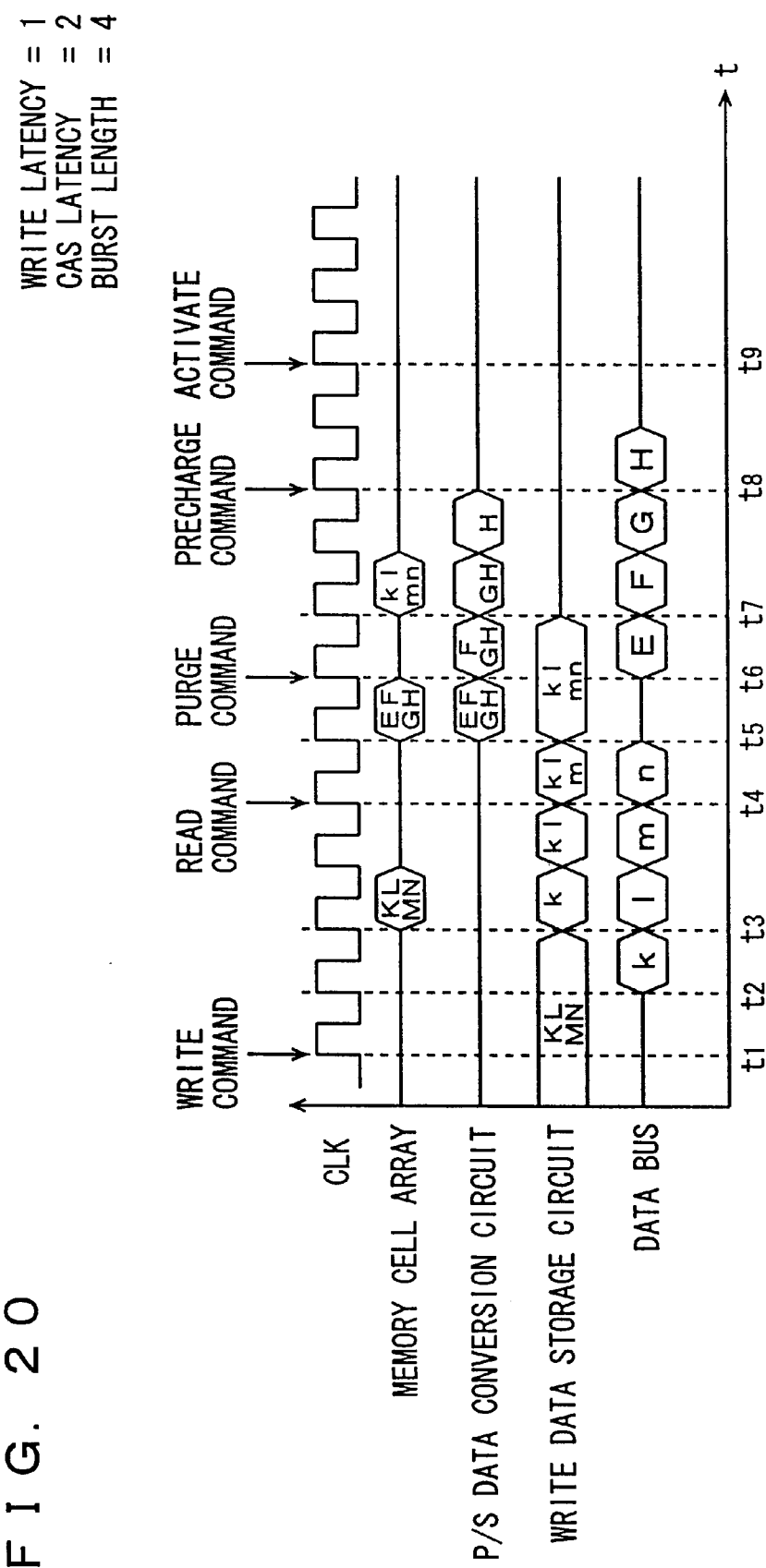

SEMICONDUCTOR MEMORY DEVICE CAPABLE OF HIGH SPEED INPUT/OUTPUT OF WIDE BANDWIDTH DATA BY IMPROVING USAGE EFFICIENCY OF EXTERNAL DATA BUS

BACKGROUND OF THE INVENTION

1. Field of the Invention

The present invention relates to semiconductor memory devices, and particularly to a semiconductor memory device used as a main memory or a local memory in a system where a wide bandwidth is required.

2. Description of the Background Art

There has been remarkable evolution in the speed of computer systems. Now, efforts are made to increase the speed corresponding to DRAMs (Dynamic Random Access Memory) functioning as the main memory. With the ever increasing data rate required in accordance with a higher speed system such as a MPU (Micro Processing Unit), the trend is to further increase the speed.

As the technique to increase the speed of a DRAM, various approaches have been proposed such as increasing the operating frequency of the external data bus through which data is input or output to or from a DRAM, and providing particular data transmission methods oriented to the timing of both edges of the clock. In practice, various problems are encountered such as an insufficient valid period of data caused by higher frequencies to prevent proper data input/output, occurrence of noise, and increase in power consumption.

Attention is focused on the technology of improving the usage efficiency of the external data bus as one way to improve the bandwidth of the main memory effectively without physical difficulty.

FIG. 21 is a timing chart for describing the data input/output timing during the read/write operation in a conventional DRAM.

It is assumed that the DRAM of interest has the write latency set to 1, the CAS latency set to 2, and the burst length set to 4.

At time t1, a write command is input. At the elapse of one clock cycle at time t2, four data K, L, M and M equal to the burst length are transmitted to an external data bus (also simply referred to as "data bus" hereinafter) via an input terminal at each activation timing of a clock signal CLK.

At time t3 corresponding to the elapse of two clock cycles from time t1 when a write command has been generated, data K, L, M and N are sequentially written into a memory cell array.

In the case where a new write command is generated at time t4 when the last write data N of the first write command is transmitted to the data bus, data k, l, m and n can be transmitted to the data bus from time t5. A write operation to the memory cell array can be carried out under the set CAS latency.

In other words, when a write command is designated continuously, the so-called gap corresponding to an idle state of the data bus between commands will not be generated.

Consider the case where a read command is designated at time t7. In a readout operation, the designated data must be read out from the memory cell array to be transmitted to the data bus. Therefore, the readout operation cannot be initiated during the writing operation in which the designated write data is written into the memory cell array before time t7.

This means that data E is read out from the memory cell only after 1 clock cycle from the designation of the read command. Data E is output to the data bus at time t8 corresponding to 2 clock cycles from time t7. From time t8, four read data E, F, G and H equal to the burst length are transmitted to the data bus.

When a second read command is continuously designated at time t9, data e corresponding to the second read command can be read out at the clock timing immediately succeeding the readout of data H from the memory cell array corresponding to the first read command. At time t10, data e can be transmitted with no gap right after the output of read data H.

As described with reference to FIG. 21, the data bus can be used with no gaps to achieve high usage efficiency of the data bus when only read operations or only write operations are continued in the conventional DRAM. However, when a combination of a read operation and a write operation is continuously designated, it will become difficult to maintain a high usage efficiency of the data bus since a gap period represented by tg in FIG. 21 is generated.

The cause of such a problem when a read operation and a write operation are designated continuously is set forth in the following. The first factor is that the data base through which data is transferred with respect to the DRAM is provided in common for both operations despite the fact that the data transfer direction differs between the read operation and the write operation. The second factor is that it is extremely difficult to freely execute a read operation and a write operation at the same time in the memory cell array of a DRAM.

SUMMARY OF THE INVENTION

An object of the present invention is to provide a structure of a highspeed semiconductor memory device having a wide bandwidth by avoiding concurrence of a read operation and a write operation in a data bus and a memory cell array to improve the data bus usage efficiency.

According to an aspect of the present invention, a semiconductor memory device that can input/output a plurality of data transmitted as a data train in time series by an external data bus in each one readout operation and one write operation includes a memory cell array, a control circuit, a row select circuit and column select circuit, a write data retain circuit, a read data retain circuit, and an input/output select circuit.

The memory cell array includes a plurality of memory cells arranged in a matrix.

The control circuit generates a command signal to carry out a read operation and a write operation of data with respect to a memory cell array.

The row select circuit and the column select circuit select a plurality of select memory cells that become the subject of one read operation and one write operation.

The write data retain circuit temporarily holds a plurality of data transmitted through the external data bus, and then transmits the same to the memory cell array in a write operation.

The read data retain circuit temporarily holds a plurality of data output from the memory cell array, and then sequentially transmits the data to the external data bus in a readout operation.

The input/output select circuit transfers data between each of a plurality of select memory cells and the write and read data retain circuits.

The main advantage of the present invention is that data of a wide bandwidth can be processed speedily by improving the usage efficiency of the data bus and avoiding concurrence of a read operation and a write operation in the memory cell array, since the transfer of the data between the memory cell array and the data bus is carried out independently by the read data retain circuit used in a read operation and the write data retain circuit used in the write operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a timing chart to describe the operation of semiconductor memory device 1100 when an auto purge command is designated in association with a write command.

FIG. 20 is a timing chart to describe an entire operation of semiconductor memory device 1200.

DESCRIPTION OF THE PREFERRED EMBODIMENTS

Figure 1:
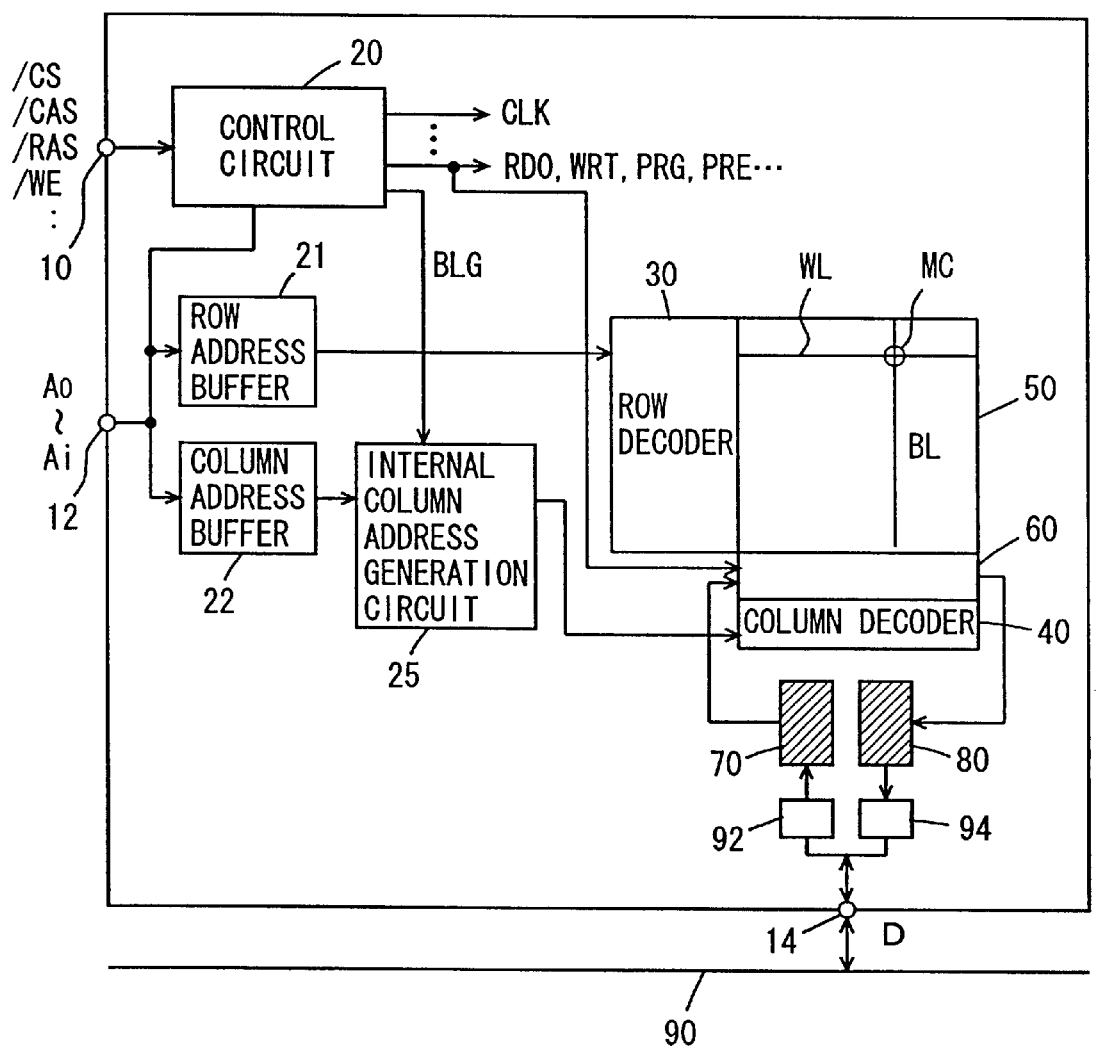
FIG. 1 is a schematic block diagram showing an entire structure of a semiconductor memory device 1000 according to a first embodiment of the present invention.

Embodiments of the present invention will be described with reference to the drawings. In the drawings, the same reference characters denote identical or corresponding components.

First Embodiment

In the first embodiment, a structure that allows data of the burst length to be handled at one time during the read/write operation in a memory cell array will be described.

Referring to FIG. 1, a semiconductor memory device 1000 of the first embodiment includes a control signal input terminal 10 to which control signals /CS, /CAS, /RAS, /WE and the like are input, an address input terminal 12 to which each bit of address signal A0-Ai (i: natural number) are input, and a data input/output terminal 14 through which read/write data is input/output. Here, signal /CS is a chip select signal indicating that semiconductor memory device 1000 is selected. Signal /RAS is a row address strobe signal to render the row related operation active. Signal /CAS is a column address strobe signal to render the column related operation active. Signal /WE is a signal designating a write operation with respect to semiconductor memory device 1000.

Semiconductor memory device 1000 further includes a control circuit 20 receiving various control signals through control signal input terminal 10 to generate a clock signal CLK and internal control signals RDO, WRT or the like. Clock signal CLK generated by control circuit 20 becomes the basis of the entire operation of semiconductor memory device 1000. The internal control signal includes a read signal RDO designating a readout operation, a write signal WRT designating a write operation, a precharge signal PRE designating a precharge operation to set the bit line potential to the precharge potential prior to a readout operation, and the like. Control circuit 20 also receives some bits of the address signal input at address input terminal 12 to set the burst length, the latency, and the like. The set burst length is transmitted to an internal column address generation circuit 25 by a burst length set signal BLG.

Semiconductor memory device 1000 further includes a memory cell array 50. Memory cell array 50 includes a plurality of memory cells MC arranged in a matrix. A word line WL is arranged corresponding to each line of memory cells MC. A bit line BL is arranged for each column of memory cells MC. A row of memory cells is selectively rendered active by row decoder 30. A column of memory cells is selectively rendered active by column decoder 40. The address signal input through address input terminal 12 is transmitted to row decoder 30 and column decoder 40 via a row address buffer 21 and a column address buffer 22.

Row decoder 30 renders a word line WL active according to an address signal.

An internal column address generation circuit 25 generates internal column address signals to select a plurality of columns according to the burst length with the column address of reference applied to column address buffer 22 as the head column address. The internal column address signals are transferred to column decoder 40.

In semiconductor memory device 1000, memory cell columns corresponding in number to the burst length according to the internal column address signal are rendered active at the same time in one column select operation.

Semiconductor memory device 1000 further includes a sense I/O circuit 60. Sense I/O circuit 60 includes a sense amplifier circuit to amplify the potential difference between a pair of bit lines, an I/O gate providing the output of the sense amplifier circuit corresponding to the activated memory cell column, and a precharge circuit to connect each bit line pair with the precharge power supply interconnection supplying the precharge potential according to a precharge signal (not shown).

Semiconductor memory device 1000 temporarily holds a serial data train of the bit length applied from a data bus 90 by a write command and converts the same into parallel data. In the memory cell array, the write operation of the parallel data is carried out at one time according to the internal column address signals.

Similarly, by carrying out a column select operation according to internal column address signals in a readout operation, the data of the burst length can be read out at the same time from the memory cell array. The readout data output at one time as parallel data is temporarily retained and then converted into a train of serial data to be sequentially output to data bus 90 via data input/output terminal 14.

Semiconductor memory device 1000 further includes a S/P data conversion circuit 70 functioning as a circuit to temporarily store the write data to convert the train of serial write data from data bus 90 into parallel data, and a P/S data conversion circuit 80 functioning as a circuit to temporarily store the read data to convert the parallel data read out at one time from the memory cell array into a train of serial data.

Sense I/O circuit 60 responds to internal control signals RDO and WRT to transfer the read and write data between the selected memory cell and S/P and P/S data conversion circuits 70 and 80.

The read and write data are transmitted through data bus 90 to be input/output to/from semiconductor memory device 1000 via data input/output terminal 14. An input buffer 92 is provided between input/output terminal 14 and S/P data conversion circuit 70. An output buffer 94 is provided between P/S data conversion circuit 80 and input/output terminal 14.

For the sake of simplification, only one data bus 90 and one data input/output terminal 14 are illustrated in FIG. 1. In practice, a plurality of the data input/output system formed of a data bus and a data input/output terminal, a buffer, a P/S data conversion circuit and a S/P data conversion circuit and the like provided correspondingly can be arranged in parallel.

Figure 2:
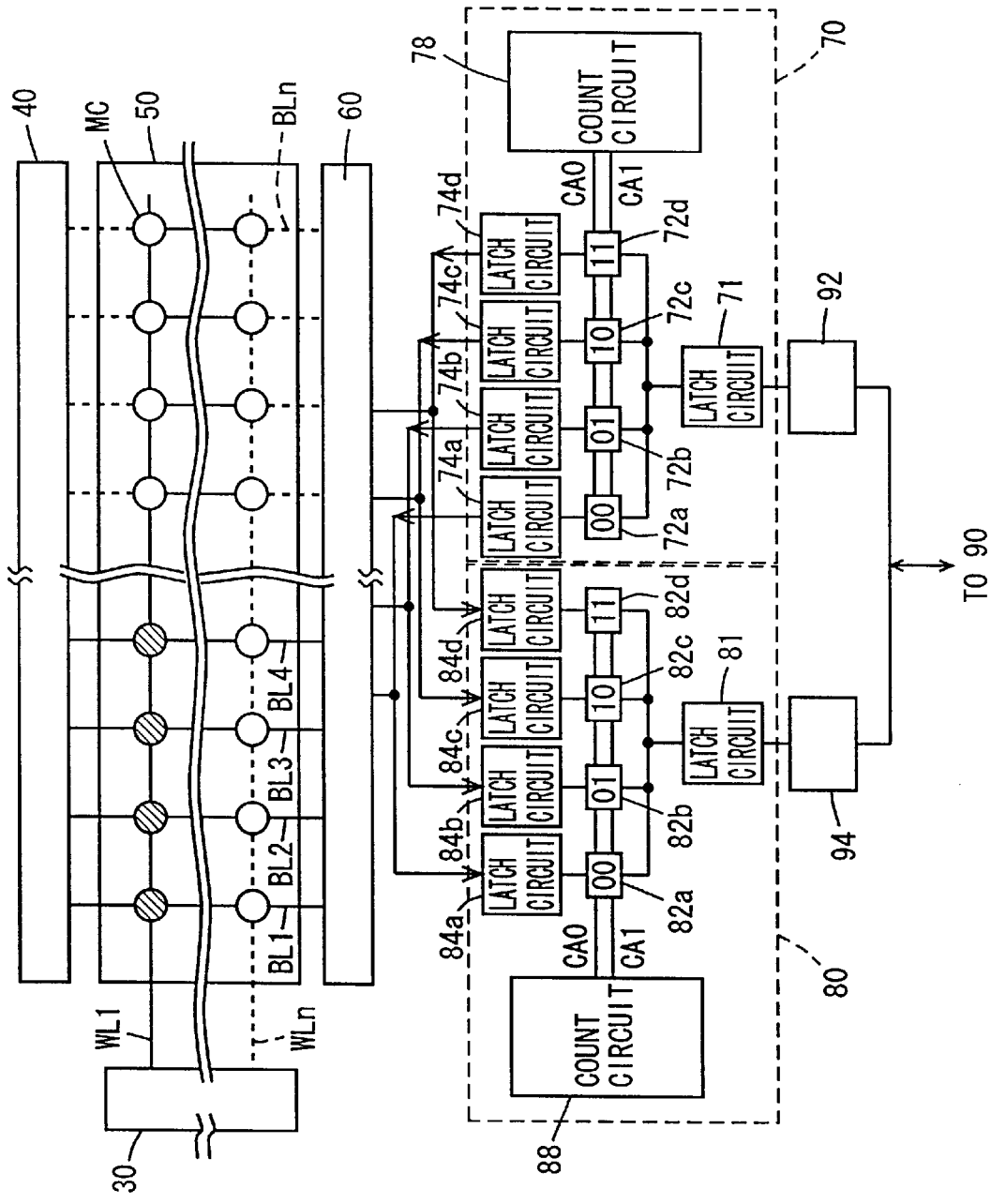
FIG. 2 is a block diagram to describe the structure and operation of a S/P data conversion circuit 70 and a P/S data conversion circuit 80.

FIG. 2 is a block diagram to describe the structure and operation of S/P data conversion circuit 70 and P/S data conversion circuit 80.

First, the operation of writing externally provided data transmitted through the data bus into the memory cells corresponding to the hatched region in FIG. 2 will be described.

S/P data conversion circuit 70 receives via input/output terminal 14 and input buffer 92 the data which is the serial data transmitted through data bus 90 to convert the same into parallel data. The parallel data is transmitted to I/O circuit 60.

S/P data conversion circuit 70 includes a latch circuit 71 receiving and latching the write data from input buffer 92, four gate circuits 72a–72d connected to latch circuit 71, four latch circuits 74a–74d connected to gate circuits 72a–72d, respectively, and a count circuit 78 responsive to activation of the clock signal to count up the 2-bit count signals CA0 and CA1.

One of gate circuits 72a–72d is selectively turned on in response to the combination of the status of count signals CA0 and CA1 generated by count circuit 78.

Figure 3:
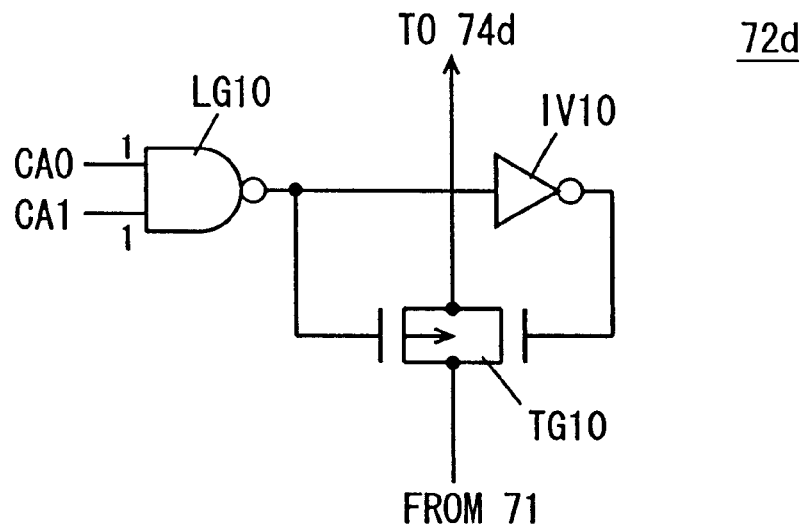
FIG. 3 is a circuit diagram showing a structure of a gate circuit 72d.

FIG. 3 is a circuit diagram showing an example of the structure of gate circuit 72d. Gate circuit 72d includes a logic gate LG10 receiving count signals CA0 and CA1, an inverter IV10 inverting the output of logic gate LG10, and a transfer gate TG10 turned on/off according to the output of logic gate LG10. The output of logic gate LG10 is rendered active (set to an L level) when both count signals CA0 and CA1 are at an H level, whereby transfer gate TG10 is turned on. In response, the write data transmitted to latch circuit 71 is selectively sent to latch circuit 74d when both count signals CA0 and CA1 are at the H level (i.e., count value is 3).

The other gate circuits 72a–72c have a similar circuit structure, provided that the signal input to logic gate LG10 differs. For example, the inverted signals of CA0 and CA1 are applied to the input of logic gate LG10 so that the transfer gate is turned on when both count signals CA0 and CA1 are at an L level in gate circuit 72a.

Similarly, gate circuit 72b has the input of the logic gate defined so as to be turned on when count signal CA0 is at an L level and count signal CA1 is at an H level.

Gate circuit 72c has the input of the logic gate defined so as to be turned on when count signal CA0 is at an H level and count signal CA1 is at an L level.

By arranging gate circuits 72a–72d of the above-described structure between latch circuit 71 and latch circuits 74a–74d, respectively, each of the four write data corresponding to the bit length transmitted onto the data bus is sequentially stored in latch circuits 74a–74d according to the change in count signals CA0 and CA1 incremented by count circuit 78 at every one clock cycle.

Referring to FIG. 2 again, the internal column address signals are generated and transmitted to column decoder 40. This internal column address signals are generated to render active a predetermined number of columns of memory cells corresponding in number to the burst length with the column address corresponding to the first write data as the head. For the sake of representation, column decoder 40 and sense I/O circuit 60 are illustrated to sandwich memory cell array 50 in FIG. 2.

The internal column address signal is formed of a predecode signal of a plurality of bits. The column decoder includes a plurality of predecoders arranged for every column of memory cells. Each predecoder is rendered active when the state of each bit in the predecode signal matches a predetermined state defined for each predecoder.

By forcing each predecoder to identify a matching state independent of the state of the predecode signal with respect to a portion of the bits in the predecode signal, a plurality of memory cell columns can be rendered active efficiently in response to an externally applied single column address by the internal column address generation circuit. By altering the number of bits of the predecode signal that is forced to identify a matching state according to the burst length, the number of memory cell columns that are rendered active at the same time by column decoder 40 can be set according to the burst length.

In the example of FIG. 2 where the burst length is set to 4, two bits of the predecode signal are forced to identify a matching state in each predecoder, whereby 4 columns of memory cells corresponding to BL1–BL4 become the subject of activation.

Thus, the data stored in latch circuits 74a–74d are simultaneously written in parallel into the memory cells (BL1–BL4 indicated by the hatched region) connected to word line WL1 and but lines.

Next, consider the case of reading out data from the memory cells indicated by the hatched region. Bit lines BL1–BL4 become the subject of simultaneous activation according to the internal column address signals generated by internal column address generation circuit 25. The data stored in four memory cells are transmitted in parallel to P/S data conversion circuit 80 by sense I/O circuit 60.

P/S data conversion circuit 80 includes latch circuits 84a–84d to store the data read out at the same time in parallel according to the internal column address signal from the memory cell array, a latch circuit 81 to latch the data read out serially, gate circuits 82a–82d provided between latch circuit 81 and latch circuits 84a–84d, respectively, and a count circuit 88 counting up count signals CA0 and CA1 according to activation of the clock signal.

Gate circuits 82a–82d carry out an operation similar to the operation described with reference to gate circuits 72a–72d. One gate circuit is selectively turned on in response to the combination of the status of count signals CA0 and CA1 generated by count circuit 88. Thus, the readout data stored in respective latch circuits 84a–84d are sequentially transmitted to latch circuit 81 to be sent to data bus 90 as serial data via output buffer 94.

Figure 4:
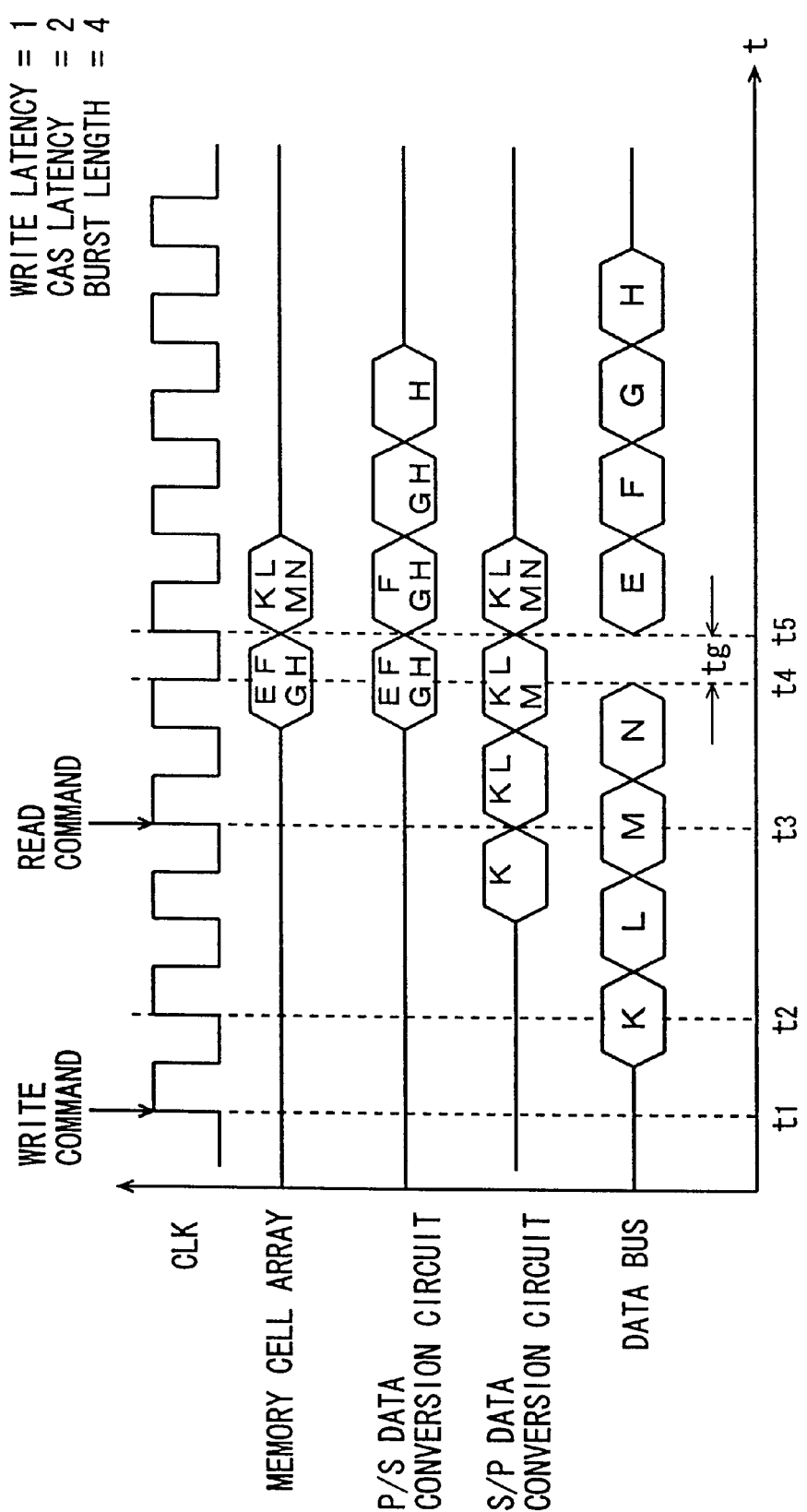
FIG. 4 is a timing chart to describe the data input/output timing during a read/write operation of semiconductor memory device 1000 of the first embodiment.

FIG. 4 is a timing chart to describe the data input/output timing during a read/write operation of semiconductor memory device 1000 of the first embodiment.

At time t1, a write command is input. From time t2, four write data K, L, M and N equal to the burst length are sequentially applied to the data bus. The write data transmitted through the data bus is transferred to S/P data conversion circuit 70 at every one clock cycle. At time t5, all data K, L, M and N are all stored in S/P data conversion circuit 70.

When a read command is input at time t3, the write data transmitted through the data bus is transmitted to S/P data conversion circuit 70 at time t4 which is the next clock active timing. Since a write operation is not yet executed in the memory cell array, a readout operation is immediately executed to read out predetermined data E, F, G and H. The read out data E, F, G and H are transmitted to P/S data conversion circuit 80.

At time t5, the data stored in P/S data conversion circuit 80 through the data bus can be sequentially read out since transmission of the write data has ended. Thus, data E, F, G and H are sequentially transmitted to the data bus for every one clock timing from time t5.

Since the read data is already transferred to the P/S data conversion circuit 80 at time t5, a write operation can be carried out with respect to the memory cell array. Therefore, write data K, L, M and N stored in S/P data conversion circuit 70 can be read out in parallel to the corresponding memory cells at this timing.

Figure 21:
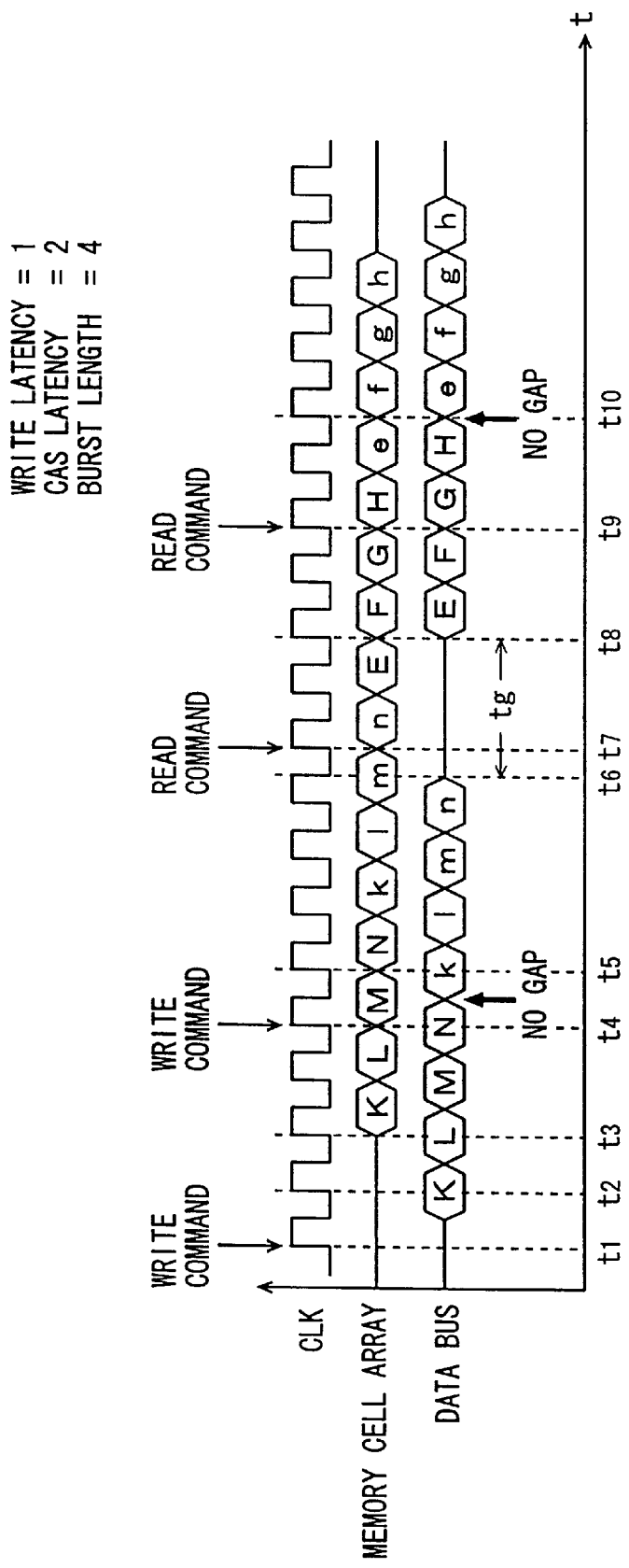
FIG. 21 is a timing chart to describe the data input/output timing during a read/write operation of a conventional DRAM.

By storing the write data and the read data in the P/S data conversion circuit and the S/P data conversion circuit while reading out or writing the data of the burst length at one time with respect to the memory cell array, the gap tg generated at the data bus is limited within the cycle of 0.5 of the clock signal when a read operation and a write operation are continuously designated. This gap is shorter by two clock cycles than the gap of 2.5 cycles of the clock signal in the conventional DRAM of FIG. 21. Therefore, the usage efficiency of the data bus can be improved significantly, whereby the process of data corresponding to the bit length to be carried out speedily.

The first embodiment is described with 4 taken as the example of the burst length. Data corresponding to a variable burst length can be processed at one time by a similar manner when the burst length is set to a variable value.

Modification of First Embodiment

In the present modification of the first embodiment, the structure of a data conversion circuit that can handle data of the burst length at one time according to a variable set burst length will be described.

In general, the burst length in a semiconductor memory device can be set variable by the combination of a portion of bits of the address signal. It is therefore necessary to account for a structure that can dynamically correspond to change in the burst length.

In the modification of the first embodiment, the S/P data conversion circuit includes a count circuit 178 instead of count circuit 78 in comparison with the structure shown in FIG. 2.

Count circuit 178 generates auxiliary count signals CA0' and CA1'. Gate circuits 72a–72d are turned on/off in response to the auxiliary count signals generated by count circuit 178. The remaining component of the S/P data conversion circuit is similar to that of S/P data conversion circuit 70. Therefore, description thereof will not be repeated.

Figure 5:
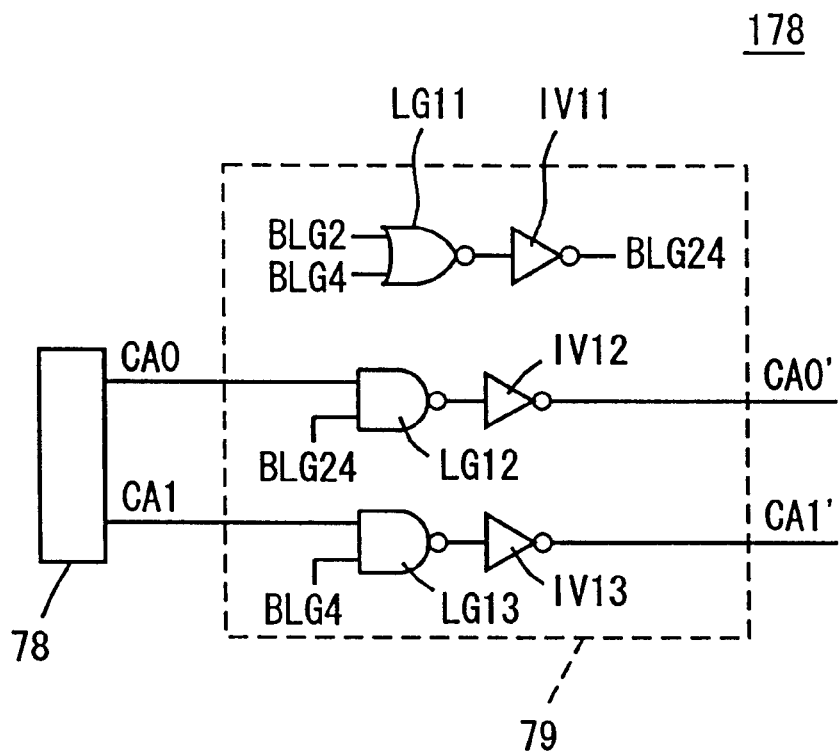
FIG. 5 is a circuit diagram to describe a structure of a count circuit 178.

FIG. 5 is a circuit diagram to describe the structure of count circuit 178.

Referring to FIG. 5, count circuit 178 includes a count circuit 78 corresponding to the two bits already described, and an auxiliary count circuit 79.

Count circuit 78 generates the 2 bits of count signals CA0 and CA1.

Auxiliary count circuit 79 includes a logic gate LG11 receiving a signal BLG2 rendered active when the burst length is set to 2 and a signal BLG4 when the burst length is set to 4 as the two inputs to output an NOR operation result, and an inverter IV11 inverting the output of logic gate LG11 to output a signal BLG24. Signal BLG24 is activated (H level) when the burst length is 2 or 4, i.e. when not 1.

Auxiliary count circuit 79 further includes a logic gate LG12 signal receiving one count signal CA0 output from count circuit 78 and signal BLG24 as the two inputs to carry out a NAND operation, an inverter IV12 inverting the output of logic gate LG12 to output an auxiliary count signal CA0', a logic gate LG13 with the other count signal CA1 and signal BLG4 as the two inputs to output a NAND operation result, and an inverter IV13 inverting the output of logic gate LG13 to generate an auxiliary count signal CA1'.

Auxiliary count circuit 79 constantly sets auxiliary count signals CA0' and CA1' at the L level by rendering signals BLG24 and BLG14 inactive to attain an L level when the burst length is 1. Accordingly, only latch circuit 74a corresponding to fixed auxiliary count signals CA0' and CA1' transfers the data with respect to the data bus when the burst length is set to 1.

Since auxiliary count circuit 79 has signal BLG24 set to the H level and BLG4 set to an L level when the burst length is 2, auxiliary count signal CA1' is constantly set at an L level whereas auxiliary count signal CA0' is counted up according to count signal CA0 output from count circuit 78. Thus, gate circuits 72a and 72c are alternately turned on at every one clock timing.

When the burst length is set to 4, signals BLG24 and BLG4 are both set at the H level. Therefore, auxiliary count signals CA0' and CA1' equal count signals CA0 and CA1 output from count circuit 78. Thus, an operation similar to that described with reference to FIG. 2 is carried out.

Similarly, the P/S data conversion circuit includes a count circuit 188 instead of count circuit 88 in comparison with the structure of FIG. 2. Count circuit 88 has a structure similar to that of count circuit 178 and includes an auxiliary count circuit 89 having a structure similar to that of auxiliary count circuit 79. Therefore, description thereof will not be repeated.

Count circuit 188 generates auxiliary count signals CA0' and CA1', whereby gate circuits 82a–82d are turned on/off in response to the auxiliary count signals generated by count circuit 188. The remaining elements of the P/S data conversion circuit are similar to those of P/S data conversion circuit 80. Therefore, description thereof will not be repeated.

By controlling the on/off of the gate circuits in the S/P and P/S data conversion circuits by the count circuit of the above-described structure, a structure can be implemented in which data of the burst length can be processed at one time in accordance with the change in the variable burst length. In the modification of the first embodiment, description is provided for the case where the burst length is switched among 1, 2 and 4. The same effect can be achieved by a similar way when the burst length is set to a variable value in another range.

Second Embodiment

The second embodiment of the present invention is directed to improve the usage efficiency of the data bus by providing a circuit to temporarily store write data in the memory and providing control of the write operation of the memory cell array with respect to the saved write data.

Figure 6:
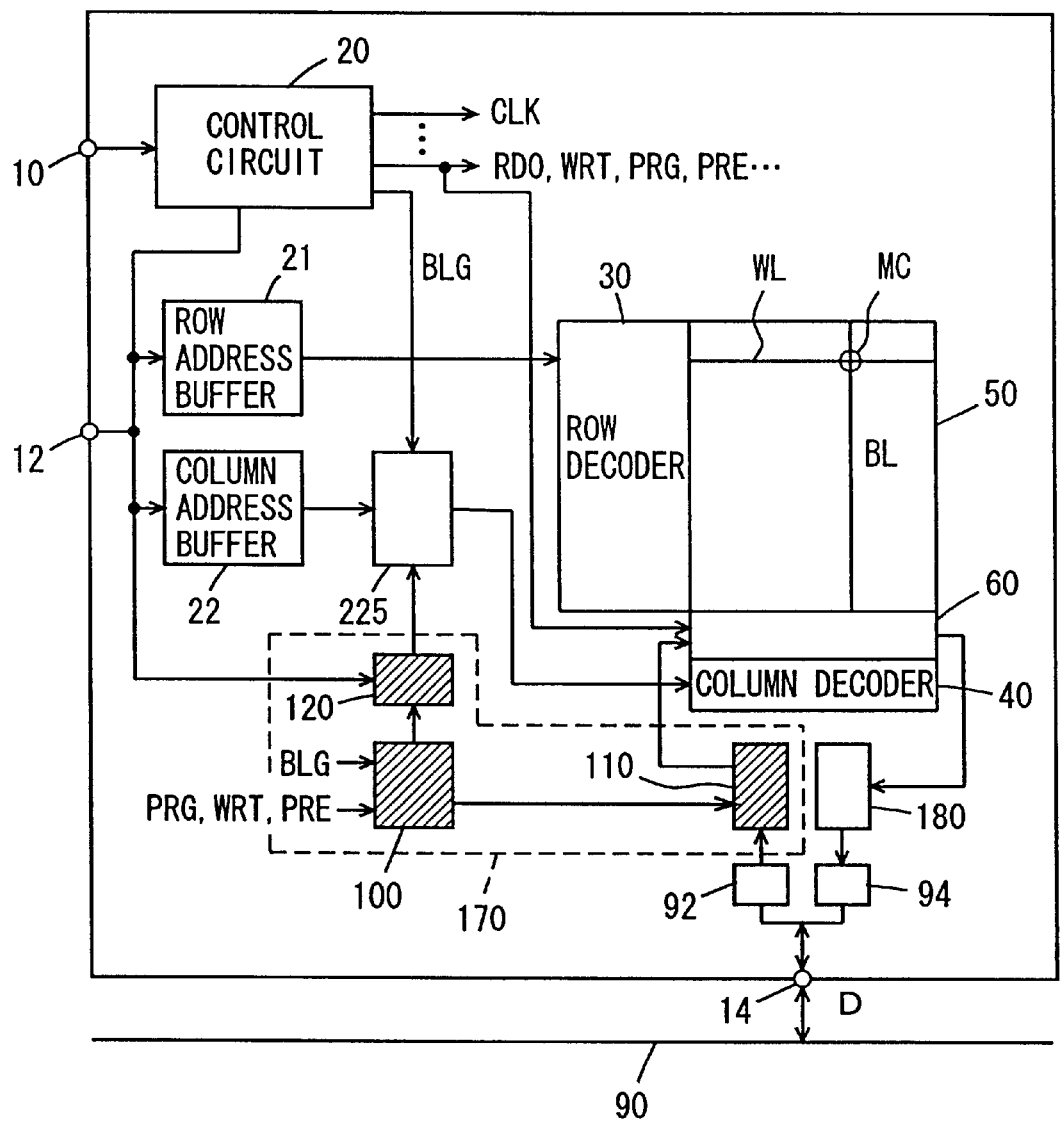
FIG. 6 is a block diagram showing an entire structure of a semiconductor memory device 1100 according to a second embodiment of the present invention.

FIG. 6 is a schematic block diagram showing the entire structure of a semiconductor memory device 1100 of the second embodiment.

Semiconductor memory device 1100 of the second embodiment shown in FIG. 6 differs from semiconductor memory device 1000 of the first embodiment in that a write data retain circuit 170 is provided instead of S/P data conversion circuit 70 and a read data retain circuit 180 is provided instead of P/S data conversion circuit 80. Write data retain circuit 170 includes a write data storage circuit 110, a column address storage circuit 120, and a write control circuit 100. Read data retain circuit 180 functions to temporarily retain the readout data.

In contrast to the first embodiment, semiconductor memory device 1100 carries out column selection by the so-called burst operation in which one column of memory cells is rendered active in one column select operation and in which the column address of the column of memory cells to be activated is sequentially counted up and switched under the state where the same word line maintains activation.

An internal column address signal generation circuit 225 of the second embodiment carries out a count up operation a number of times corresponding to the burst length with the column address serving as the reference as the head address. Internal column address signal generation circuit 225 generates internal column address signals that sequentially specifies a column of memory cells of a predetermined number of columns of memory cells corresponding in number to the burst length.

Semiconductor memory device 1100 temporarily has the write data transmitted through data bus 90 temporarily stored in write data storage circuit 110 without being directly written into the memory cell array. By executing the readout operation in the memory cell array with priority, the concurrence of a read operation and a write operation can be avoided.

When a newly designated write command is to be executed when data is stored in the write data storage circuit by generation of a certain write command, that stored data must be transferred from the write data storage circuit to the memory cell array in advance. Since the address corresponding to the stored write data must have only the column address stored in column address storage circuit 120, the data stored in the write data storage circuit must be written into the memory cell array in advance even in the case where a precharge command is designated that requires in activation of the word line.

In the second embodiment, a command decoder circuit 131 generating an internal control signal PRG to designate a command (referred to as purge command hereinafter) to execute the operation of sending out the write data stored in write data storage circuit 110 to the memory cell array (purge operation) is additionally provided in control circuit 20.

Figure 7:
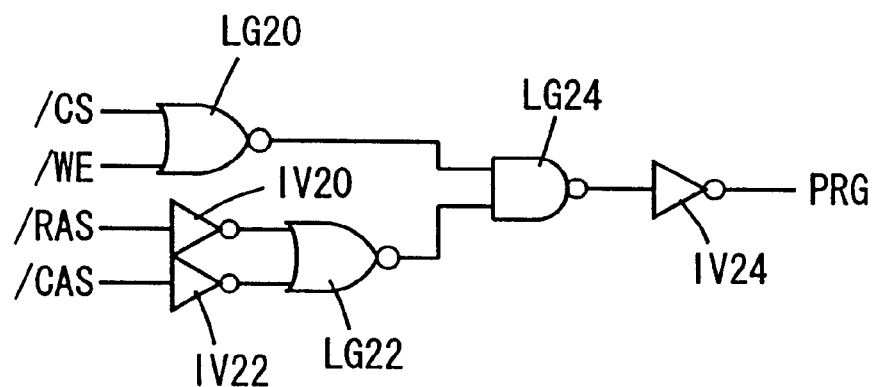
FIG. 7 is a circuit diagram showing a structure of a command decode circuit 131 generating a purge command signal.

FIG. 7 is a circuit diagram showing a structure of command decode circuit 131 generating a purge command signal PRG. Command decode circuit 131 assigns an unused combination of the control signals to a purge command signal. Specifically, it is postulated that there is not other control signal generated by the combination of /CS=/WE=L level and /RAS=/CAS=H in semiconductor memory device 1100.

Command decode circuit 131 includes a logic gate LG20 receiving signals /CS and /WE as the two inputs to output the result of a NOR operation, inverters IV20 and IV22 inverting /RAS and /CAS, respectively, a logic gate LG22 receiving the outputs of inverters IV20 and IV22 as the two inputs to output the result of a NOR operation, a logic gate LG24 receiving the outputs of logic gates LG20 and LG22 as the two inputs to output the result of a NAND operation, and an inverter IV24 to invert the output of logic gate LG24 to provide a purge command signal PRG.

Command decode circuit 131 renders purge command signal PRG active (H level) according to the combination of signals /CS, /WE, /RAS and /CAS which is an unused combination of the generation of the other internal control signals.

Figure 8:
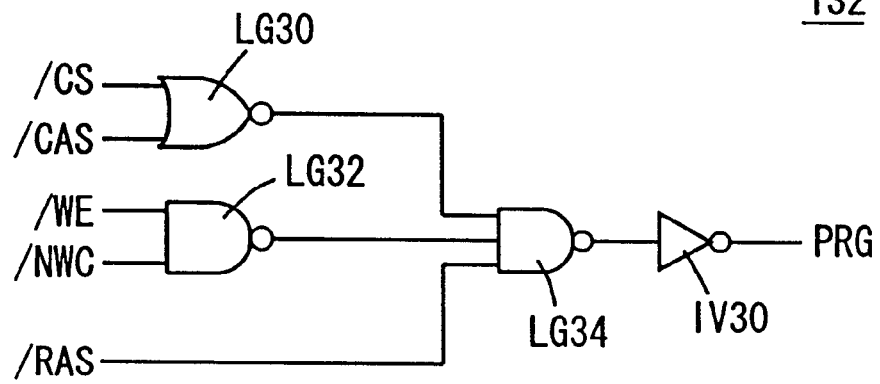
FIG. 8 is a circuit diagram showing a structure of another command decode circuit 132 generating a purge command signal.

FIG. 8 is a circuit diagram showing a structure of another command decode circuit 132 that generates purge command signal PRG.

In semiconductor memory device 1100, signal WRT designating a write operation is rendered active when /CS=/WE=/CAS=L level and /RAS=H level for the external control signals. The purge is designated in association with an externally applied new control signal /NWC.

Referring to FIG. 8, command decode circuit 132 includes a logic gate LG30 receiving signals /CS and /CAS as the two inputs to provide the result of a NOR operation, a logic gate LG32 receiving signals /WE and /NWC as the two inputs to provide the result of a NAND operation, a logic gate LG34 receiving the outputs of logic gates LG30 and LG32 and signal /RAS as the three inputs to provide the result of a NAND operation, and an inverter IV30 inverting the output of logic gate LG34 to generate purge command signal PRG.

According to the above-described structure, a purge command signal PRG can be rendered active arbitrarily by rendering an externally applied control signal /NWC active (L level) even when a write operation is not rendered active in command decode circuit 132. The structure of the command decode circuit that can render a purge command signal active in association with a new control signal /NWC is not limited to that shown in FIG. 8. A structure related to another control signal can be implemented.

A similar effect can be achieved by using one bit of the address signal for the same object instead of providing a new control signal such as /NWC.

Figure 9:
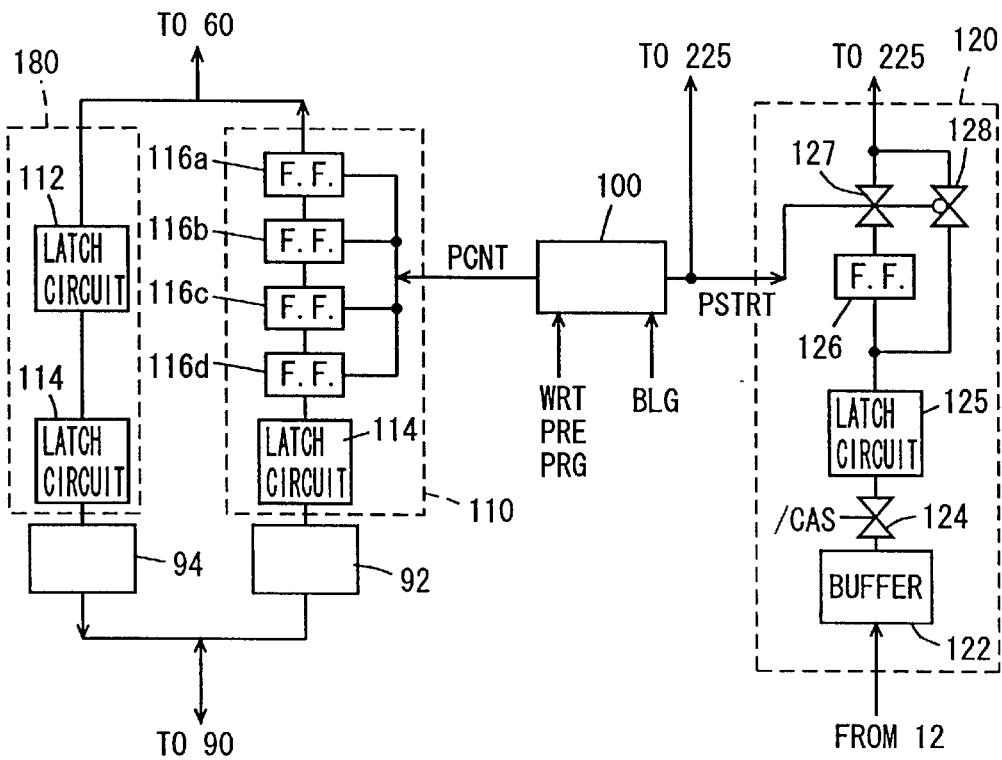
FIG. 9 is a block diagram showing a structure of circuitry related to retaining read/write data of semiconductor memory device 1100.

FIG. 9 is a block diagram showing a structure of circuitry associated with the retainment of read/write data of semiconductor memory device 1100.

Referring to FIG. 9, a write control circuit 100 receives internal command signals WRT, PRE and PRG and a burst length set data BLG to output a purge start signal PSTRT and a purge count circuit PCNT.

Write data storage circuit 110 includes a latch circuit 114 to latch data transmitted to input buffer 92, and four flip-flop circuits 116a–116d connected in series at the stage subsequent to latch circuit 114. The data of flip-flop circuits 116a–116d is sequentially sent to the next flip-flop circuit one by one in response to activation of purge count signal PCNT. The data of flip-flop circuit 116a is transmitted to sense amplifier I/O circuit 60.

By the above-described structure, the write data transmitted through the data bus is not directly written into the memory cell array, but temporarily saved in flip-flop circuits 116a–116d.

Read data retain circuit 180 includes latch circuits 112 and 114 connected between sense amplifier I/O circuit 60 and output buffer 94. More specifically, the feature to temporarily save data is not provided with respect to the read data. The read data is promptly transmitted to data bus 90 via output buffer 94 while the write data is temporarily saved in data storage circuit.

Column address storage circuit 120 includes a buffer 122 receiving an address signal input through the address input terminal, a transfer gate 124 transmitting the data of buffer 122 to a succeeding stage in response to activation of signal /CAS, and a latch circuit 125 latching an address signal transmitted to buffer 122 in response to operation of transfer gate 124. Column address storage circuit 120 includes a flip-flop circuit 126 to store the column address transmitted to latch circuit 125.

Column address storage circuit 120 includes a transfer gate 127 turned on/off in response to purge start signal PSTRT, and a transfer gate 128 turned on/off in response to an inverted signal of purge start signal PSTRT.

Transfer gate 127 is provided between flip-flop circuit 126 and internal column address generation circuit 225 to transmit the column address stored in flip-flop circuit 126 to the internal column address generation circuit when a purge operation is initiated. Internal column address generation circuit 225 sequentially generates each of internal column address signals according to the transmitted column address. A memory cell column corresponding to the stored data in write data storage circuit 110 is sequentially rendered active in response to the internal column address signal, whereby a write operation is executed appropriately.

When a purge operation is not designated, transfer gate 127 is turned off and transfer gate 128 is turned on. In response, the column address currently input at the address terminal is transmitted to internal column address generation circuit 225 when a purge operation is not designated.

Figure 10:
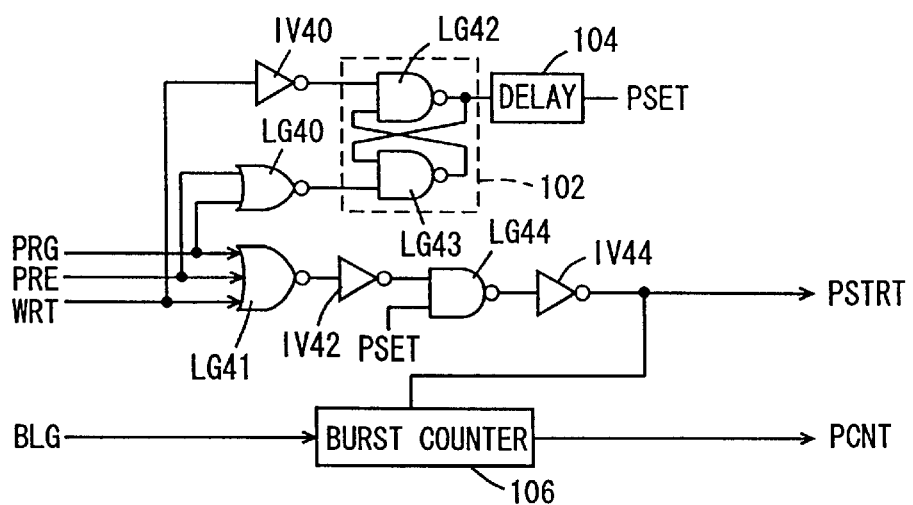
FIG. 10 is a circuit diagram showing a structure of a write control circuit 100.

FIG. 10 is a circuit diagram showing a structure of write control circuit 100.

Referring to FIG. 10, write control circuit 100 includes an inverter IV40 to invert write signal WRT, a logic gate LG40 receiving purge command signal PRG and precharge signal PRE as the two inputs to output the result of a NOR operation, logic gates LG42 and LG43 forming a flip-flop circuit 102 to receive the outputs of inverter IV40 and logic gate LG40 at the two inputs, and a delay circuit 104 delaying the output of flip-flop circuit 102. The output of flip-flop circuit 102 delayed by delay circuit 104 is the purge set signal PSET.

Purge set signal PSET is set to an H level in response to activation of write signal WRT that designates a write operation. When signal WRT is rendered inactive and when at least one of signal PRG designating a purge operation and signal PRE designating a precharge operation is at an active state (H level), signal PSET is reset to attain an L level.

Write control circuit 100 includes a logic gate LG41 receiving control signals PRG, PRE and WRT as the three inputs to provide the result of a NOR operation, an inverter IV42 inverting the output of logic gate LG41, a logic gate LG44 receiving the output of inverter IV42 and purge set signal PSET as the inputs to provide the result of a NAND operation, and an inverter IV44 inverting the output of logic gate LG44 to generate a purge start signal PSTRT.

By the above-described structure, purge start signal PSTRT is rendered active (H level) at the elapse of the delay time set by delay circuit 104 when a write operation is designated. Even if the write operation is inactive, purge start signal PSTRT is reset when at least one of the purge operation and the precharge operation is rendered active to be set to an inactive state (L level) at the elapse of the delay time similar to that of the time of activation.

Write control circuit 100 further includes a burst counter 106 receiving a burst length set signal BLG and a purge start signal PSTRT. Burst counter 106 generates a predetermined number of purge count signals PCNT in synchronization with clock signal CLK when purge start signal PSTRT is rendered active. The predetermined number of purge count signals PCNT correspondences in number to the burst length set by signal BLG. Purge count signal PCNT is transmitted to write data storage circuit 110. The data is sequentially sent to the next flip-flop circuit at each active timing of signal PCNT. Since purge count signal PCNT is repeatedly rendered active corresponding to the set burst length by burst counter circuit 106, the data of the burst length stored in the data storage circuit is sequentially written into the memory cell array when a purge operation is designated.

The entire operation of semiconductor memory device 1100 corresponding to whether a purge command is generated or not internally will be described with reference to the timing chart.

Figure 11:
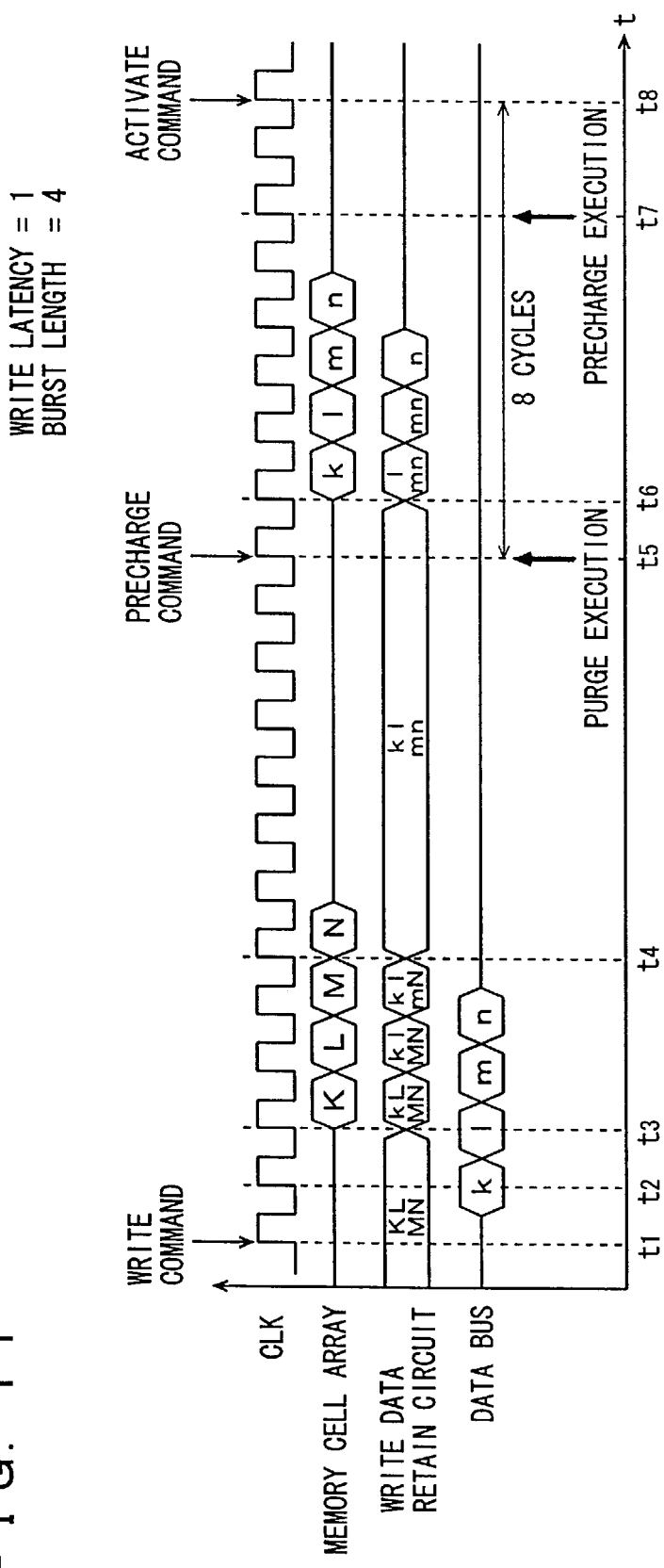
FIG. 11 is a timing chart to describe the data input/output timing during a read/write operation of semiconductor memory device 1100 when a purge command is not generated internally.

FIG. 11 is a timing chart to describe the data input/output timing of a read/write operation of semiconductor memory device 1100 when a purge command is not internally generated.

At time t1, prior to designation of a write command, write data K, L, M and N are stored in the write data storage circuit. In response to a write command, new write data k is transmitted to the data bus at time t2. At time t3 and et seq., the remaining write data l, m and n are sequentially transmitted.

At time t3, writing is initiated of the stored data in the write data storage circuit into the memory cell array. Write data K, L, M and N are stored into the memory cell array over 4 clock cycles from time t3. Meanwhile, write data k, l, m and n transmitted through the data bus are sequentially sent to the next flip-flop circuit at each one clock cycle to be stored in the write data storage circuit.

At time t4, data K, L, M and N held in the write data storage circuit initially are all written into the memory cell. Data k, l, m and n transmitted to the data bus in response to the new write command are now stored in the write data storage circuit. Thus, the write related operation is temporarily completed.

When a purge command is not positively issued within the semiconductor memory device thereafter, an externally applied precharge designation and the like is input. The contents of the write data storage circuit are maintained until it becomes necessary to send out the data stored in the write data storage circuit.

At time t5, a precharge command is externally applied. In response, a purge operation is executed. Accordingly, the writing operation of data k, l, m and n stored in the write data storage circuit into the memory cell array is initiated at time t6. Since it is necessary to maintain the active state of the word line until the write data in the write data storage circuit is transmitted to the memory cell array, the precharge operation can be initiated only at the timing of time t7.

Therefore, there is an elapse corresponding to 8 cycles of the clock signal from time t5 when a charge command is input up to time t8 when an activate command to render the next row related operation active can be accepted.

Figure 12:
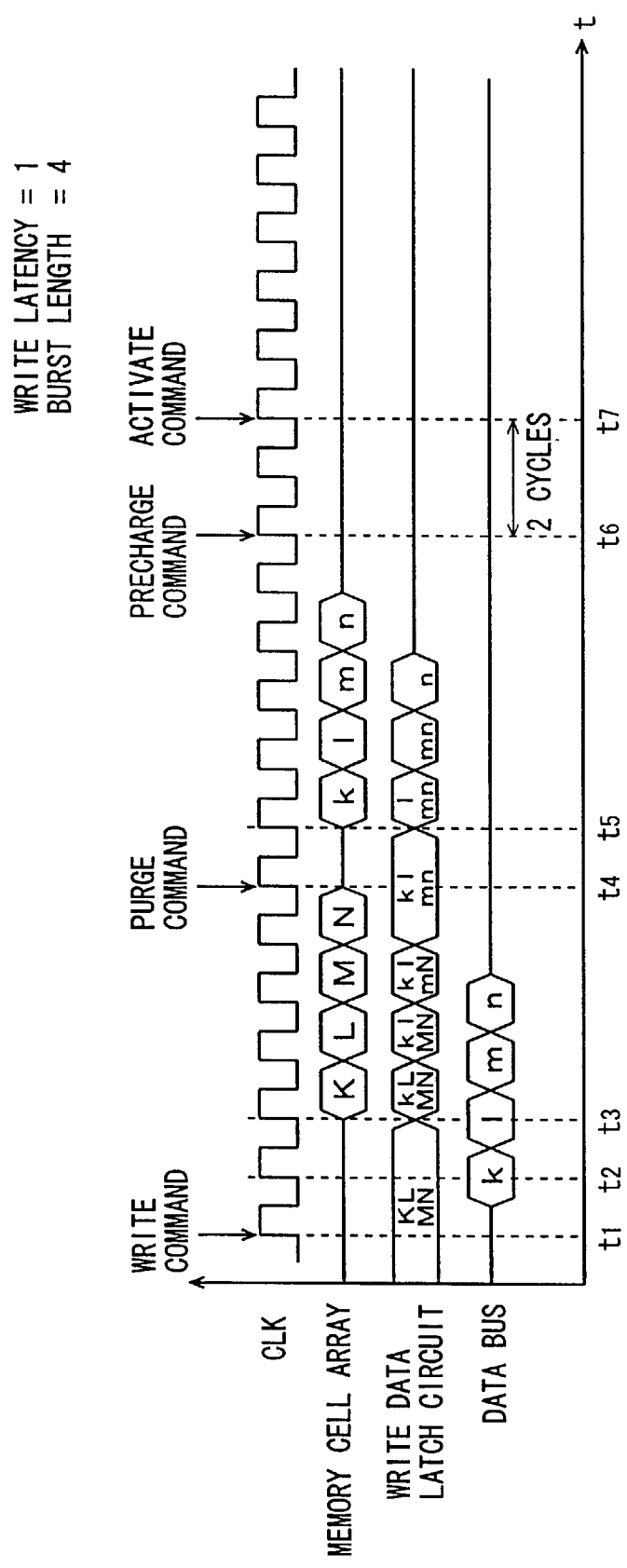
FIG. 12 is a timing chart to describe the data input/output timing during a read/write operation of semiconductor memory device 1100 when a purge command is generated internally.

FIG. 12 is a timing chart to describe the data input/output timing of a read/write operation of semiconductor memory device 1100 when a purge command is generated internally.

The operation from time t1 to t4 of FIG. 12 is similar to that of FIG. 11. Therefore, description thereof will not be repeated.

At time t4, a purge command signal PRG is generated by command decode circuit 131 or 132 even when the write operation is inactive. In response, the purge operation is executed from time t5. Data k, l, m and n stored in the write data storage circuit at the timing of time t4 is sequentially written into the memory cell array from time t5.

When a precharge command is designated at time t6 which is a timing similar to that of FIG. 11, an activate command can be executed to activate the next row related operation at time t7 at the elapse of 2 clock cycles from the input of the precharge command.

By intentionally generating an internal command signal to execute a purge operation internally even when a precharge operation or a write operation is not actually designated, the data bus can be used effectively to speed up the operation.

Modification of the Second Embodiment

In a modification of the second embodiment, a structure of designating a purge operation concurrently with another command such as a write operation, read designation and the like will be considered hereinafter.

Such a method is generally carried out even with the precharge command. When a precharge command is to be set in concurrence with a write operation or a read operation, one bit of the address signal is used to determine whether a concurrent precharge command is to be generated or not according to the level of that bit signal.

Figure 13:
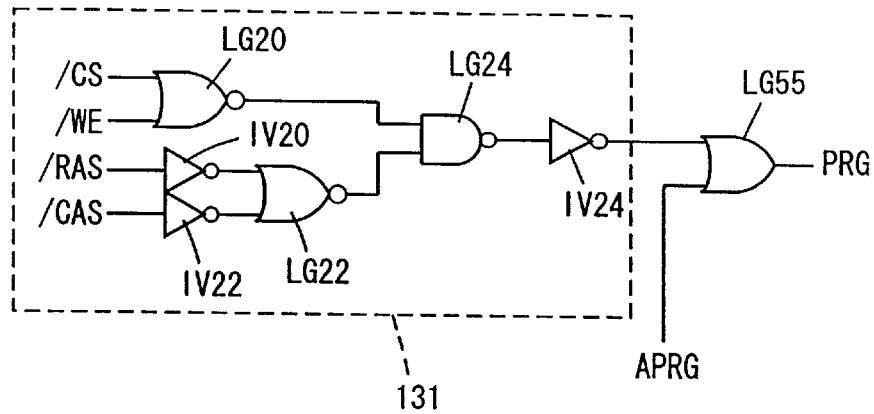
FIG. 13 is a circuit diagram showing a structure of a command decode circuit 133 generating a purge command signal PRG according to a modification of the second embodiment.

FIG. 13 is a circuit diagram showing a structure of a command, decode circuit 133 generating a purge command signal PRG according to a modification of the second embodiment.

Referring to FIG. 13, command decode circuit 133 includes logic gates LG20, LG22 and LG24 and also inverters IV20, IV22 and IV24 connected in a manner similar to that of command decode circuit 131 described with reference to FIG. 7, and a logic gate LG55. Logic gate LG55 receives the output of command decode circuit 131 and an auto purge signal APRG as the two inputs to provide the result of an OR operation as a purge command signal PRG.

Figure 14:
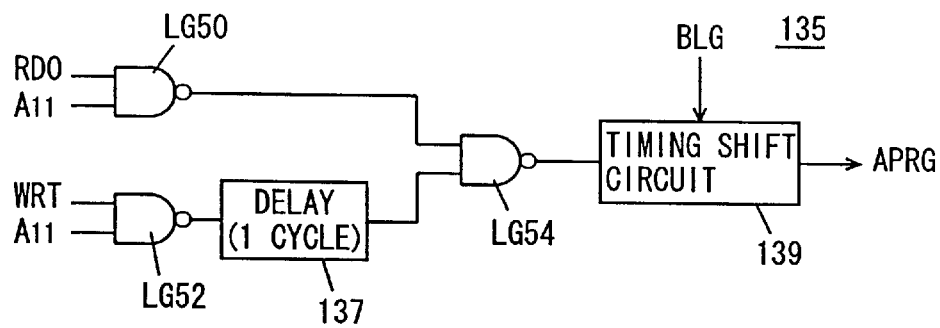
FIG. 14 is a circuit diagram showing a structure of an auto purge signal generation circuit 135.

FIG. 14 is a circuit diagram showing a structure of an auto purge signal generation circuit 135.

Auto purge signal generation circuit 135 includes a logic gate LG50 receiving a read signal RDO and one bit A11 of the address signal as the two inputs to provide the result of a NAND operation, a logic gate LG52 receiving a write signal WRT and an address signal A11 as the two inputs to provide the result of a NAND operation, a delay circuit 137 delaying the output of logic gate LG52 by the write latency and providing the delayed signal, a logic gate LG54 receiving the outputs of logic gate LG50 and delay circuit 137 as the two inputs to provide the result of a NAND operation, and a timing shift circuit 139 receiving the output of logic gate LG54.

In FIG. 14, delay circuit 137 delays the output of logic gate LG52 by one clock cycle to provide the delayed output to the input node of logic gate LG54 corresponding to write latency=1. Timing shift circuit 139 delays the input signal of the number of clock cycles corresponding to the burst length.

By the above-described structure, the output of logic gate LG54 is fixed at an L level independent of the status of write signal WRT and read signal RD when one bit of the address signal A11 is set at an L level.

When one bit of address signal A11 is set at an H level, the output of logic gate LG54 is pulled up to an H level in response to activation (H level) of the read and write signals. Timing shift circuit 139 shifts the timing for a number of clock cycles corresponding to the set burst length and renders auto purge signal APRG active (H level) when the output of logic gate LG54 attains an H level. Thus, a purge operation can be designated together at the timing when a read operation and a write operation are completed for the data of the burst length.

By automatically executing a purge operation at the timing when the data process is completed every time a write operation and a read operation are executed, it is no longer required to externally control the timing of sending out the data held in the write data storage circuit to the memory cell array. There is an advantage that the adjustment of the timing in the semiconductor memory device can be facilitated.

FIG. 15 is a timing chart to describe the operation of semiconductor memory device 1100 when an auto purge command is designated in association with a write command.

At time t1, a write auto purge command is input. Accordingly, the write command is executed from time t1, whereby data K, L, M and N retained in the write data storage circuit prior to time t1 are sent out to the memory cell array from time t3 in parallel to the transmission of new write data k, l, m, and n to the data bus from time t2. The new write data are transmitted to and stored in the write data storage circuit from time t3.

At time t4, externally applied new data k, l, m and n are all received in semiconductor memory device 1100. At this timing of the end of the operation corresponding to the write command, a purge operation is automatically executed.

More specifically, a purge operation is executed from time t4. Data k, l, m and n retained in the write data storage circuit are sequentially written into the memory cell array for every one clock cycle. Upon completion of the purge operation, a precharge command is automatically entered at the next clock timing.

Thus, only two cycles are required from the generation of a purge command up to the execution of a new activate command in the above case. It is appreciated that the operation is speeded than the operation described with reference to FIG. 11 corresponding to the case where a purge operation is not carried out intentionally.

Figure 16:
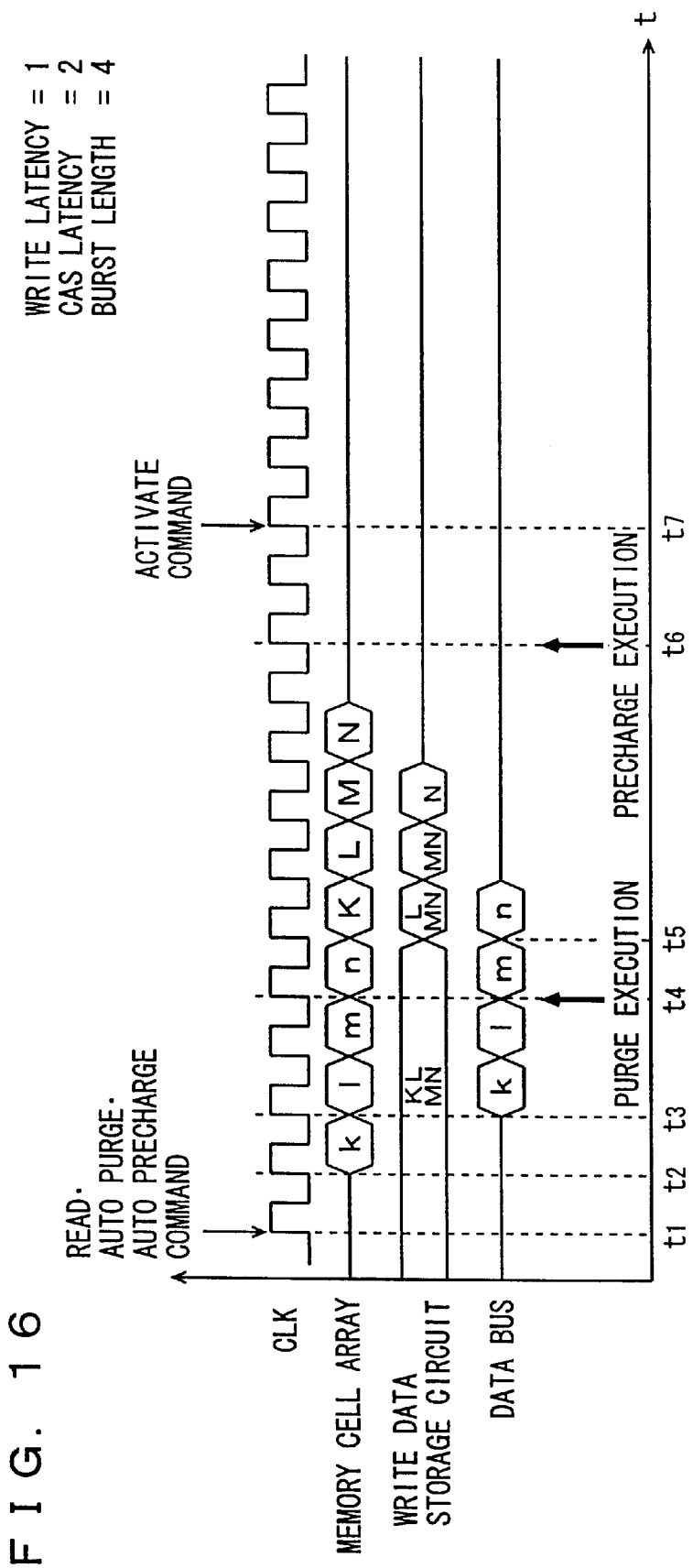
FIG. 16 is a timing chart to describe the entire operation of semiconductor memory device 1100 when auto purge and auto precharge commands are designated in association with a read operation.

FIG. 16 is a timing chart to describe the entire operation of semiconductor memory device 1100 when an auto purge command and an auto precharge command are designated accompanying a read operation.

At time t1, a read.auto purge.auto precharge command is input. In response, data K, L, M and N are stored in the write data retain circuit.

A read operation is executed from time t2. Data k, l, m and n are sequentially read out from the memory cell array. From time t3, read out data k, l, m and n are sequentially transmitted to the data bus.

At time t4 where the read operation of the memory cell array ends, a purge operation is automatically executed by the auto purge command. Accordingly, data K stored in the write data storage circuit is written into the memory cell array at time t5 which is the next clock activation timing.

Similarly, data L, M and N are written into the memory cell array at each clock activation timing. Since the environment of executing a precharge operation is established at time t6, a precharge operation is executed according to the auto precharge command. Accordingly, the next activate command can be executed from time t7.

Third Embodiment

The third embodiment is directed to further avoid collision of a read operation and a write operation in the memory cell array by combining the technique described in the first embodiment of handling the read/write data of the burst length at one time in the memory cell array and the technique of the second embodiment in which the write data is temporarily saved and then written into the memory cell array.

Figure 17:
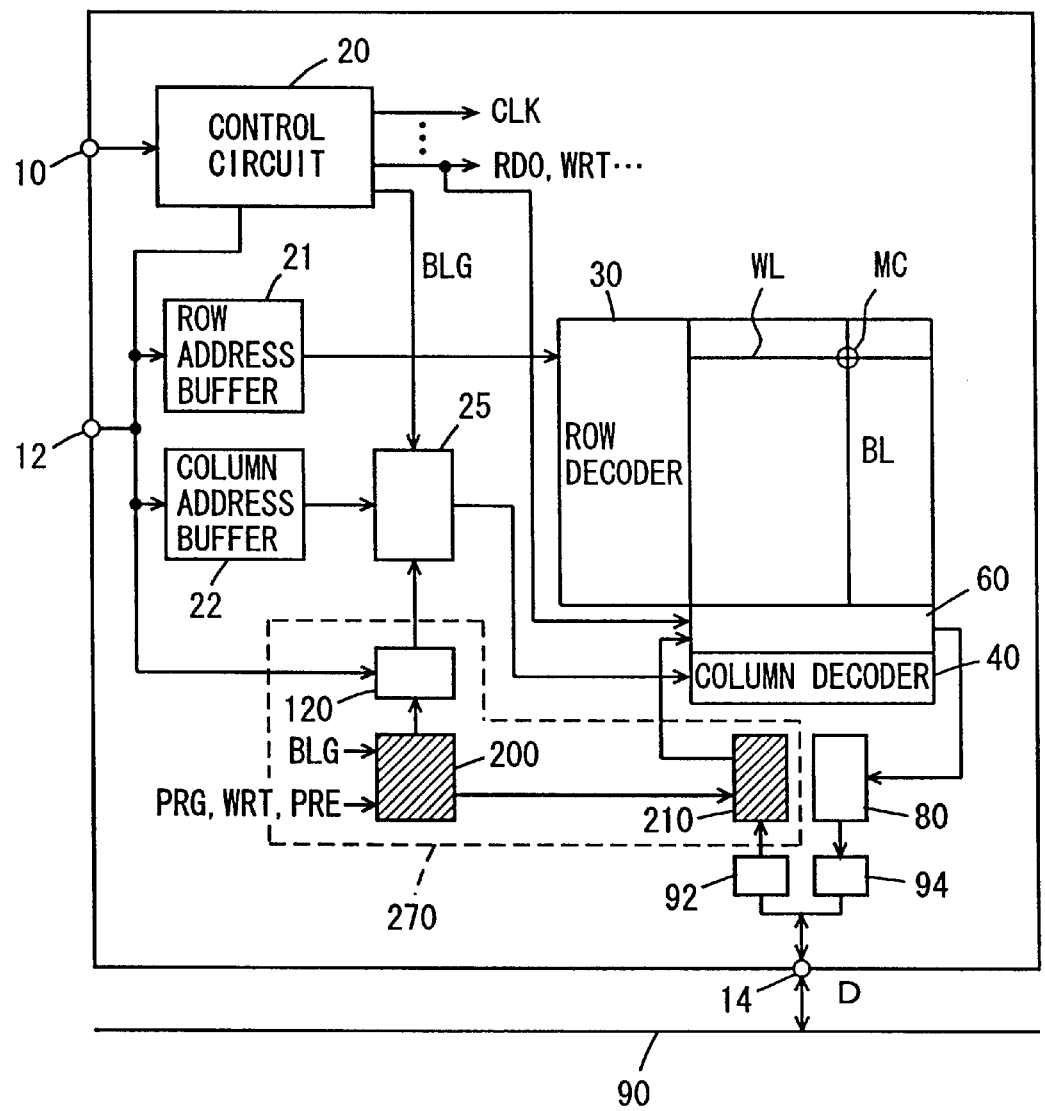
FIG. 17 is a schematic block diagram showing an entire structure of a semiconductor memory device 1200 according to a third embodiment of the present invention.

FIG. 17 is a schematic block diagram showing an entire structure of a semiconductor memory device 1200 according to a third embodiment of the present invention.

Semiconductor memory device 1200 shown in FIG. 17 differs from semiconductor memory device 1100 in that P/S data conversion circuit 80 described in the first embodiment is provided as the circuit to temporarily maintain the read data and that a write data retain circuit 270 is provided instead of write data retain circuit 170. Write data retain circuit 270 differs from write data retain circuit 170 in that a write data storage circuit 210 and a write control circuit 200 are provided instead of write data storage circuit 110 and write control circuit 100.

A column select operation is carried out similar to that described with reference to FIG. 1. Semiconductor memory device 1200 includes an internal column address generation circuit 25 similar to that in semiconductor memory device 100 to render simultaneously a predetermined number of columns of memory cells (corresponding in number to the burst length) in one column select operation in response to a generated internal column address signal.

The remaining structure and operation are similar to those described with reference to the first and second embodiments. Therefore, description thereof will not be repeated.

Figure 18:
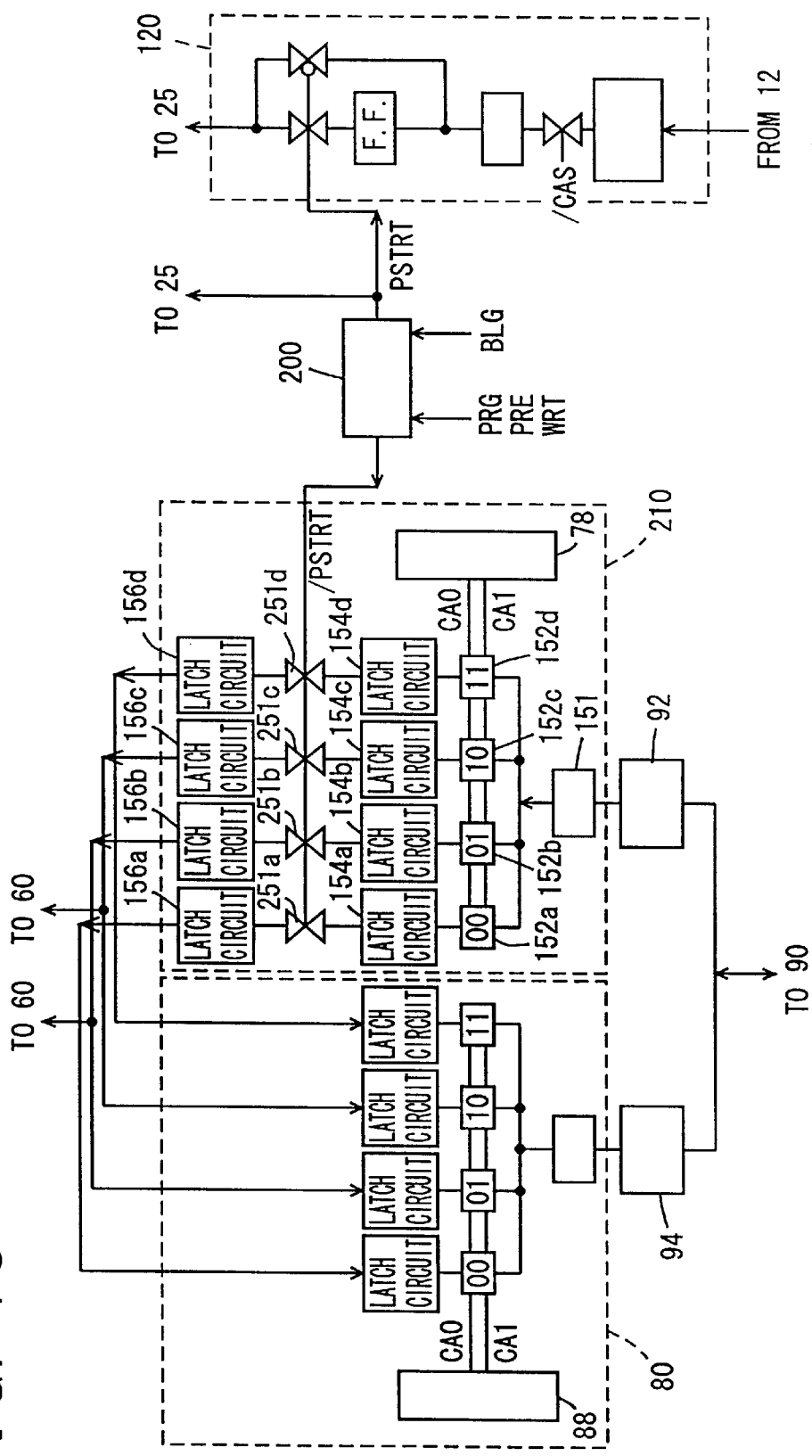
FIG. 18 is a block diagram showing a structure of circuitry associated with holding read/write data of semiconductor memory device 1200.

FIG. 18 is a block diagram showing a structure of circuitry related to maintaining read/write data in semiconductor memory device 1200.

Referring to FIG. 18, write data storage circuit 210 includes a latch circuit 151 latching data of input buffer 92, latch circuits 154a–154d transferring the data of latch circuit 151 in parallel, and gate circuits 152a–152d provided between latch circuit 151 and respective latch circuits 154a–154d.

Write data storage circuit 210 further includes transfer gates 251a–251d turned on/off in response to an inverted signal /PSTRT of purge start signal PSTRT, and latch circuits 156a–156d to transmit the data to the sense amplifier I/O circuit. Transfer gates 251a–251d are provided between respective latch circuits 154a–154d and latch circuits 156a–156d.

The serial write data transmitted to latch circuit 151 is sequentially transmitted to latch circuits 154a–154d in response to the output of counter circuit 78, similar to the operation described in the first embodiment, and then transmitted to parallel data. The parallel data held in latch circuits 154a–154d are transmitted to latch circuits 156a–156d via transfer gates 251a–251d.

Transfer gates 251a–251d are turned off under control of signal /PSTRT when a purge operation is initiated. This is to prevent the parallel data to be written into the memory cell array from being damaged until a purge operation, when executed, is completed. Signal /PSTRT is generated by write control circuit 200.

Figure 19:
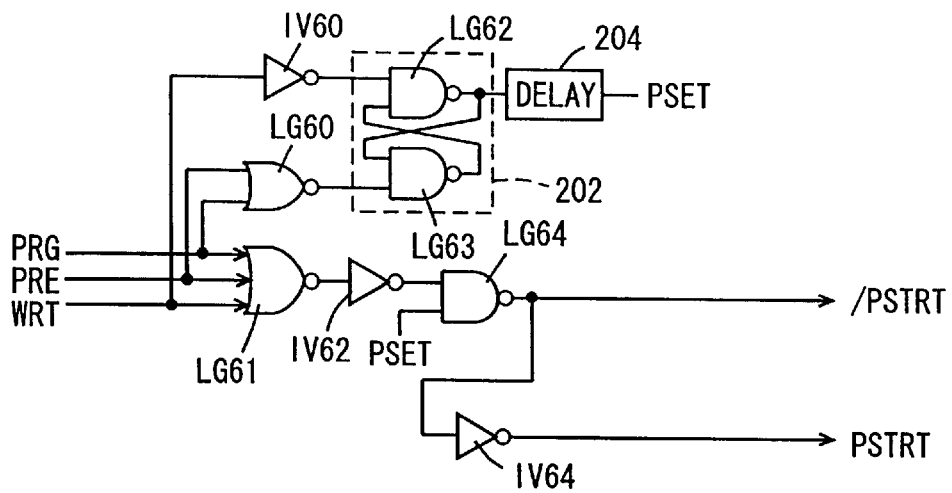
FIG. 19 is a circuit diagram showing a structure of a write control circuit 200.

FIG. 19 is a circuit diagram showing a structure of write control circuit 200.

Write control circuit 200 has a structure substantially similar to that of write control circuit 100 of FIG. 10. The connection of the logic gate generating signal PSTRT and the inverters are similar to those of write control circuit 100. Write control circuit 200 differs from write control circuit 100 in that purge counter 106 generating purge count signal PCNT is absent, and that an inverter IV64 to generate an inverted signal of purge start signal PSTRT is provided.

Referring to FIG. 18 again, column address storage circuit 120 carries out an operation similar to that of FIG. 9 in response to a purge start signal PSTRT generated by write control circuit 200. The structure and operation of P/S data conversion circuit 80 are similar to those described with reference to FIG. 2.

The auto purge signal generation circuit of FIG. 14 described in the second embodiment can be applied to semiconductor memory device 1200 to automatically carry out a purge operation in compliance with a read operation and a write operation. In this case, the delay timing of timing shift circuit 139 in the auto purge signal generation circuit is to be set to one clock cycle.

FIG. 20 is a timing chart to describe the entire operation of semiconductor memory device 1200.

At time t1, a write command is input. In response, data K, L, M and N stored in the write data storage circuit has to be written into the memory cell array. This write operation can be completed in one clock cycle at time t3 together at one time corresponding to the burst length.

From time t2, new write data k, l, m and n is sequentially transmitted to the data bus for every one clock cycle to be stored in the write data storage circuit.

Since a concurrent write operation is not generated in the memory cell array although a read command is input at time t4, the specified read data E, F, G and H can be read out at one time at time t5 corresponding to the next clock activation timing. Data E, F, G and H are sequentially transmitted to the data bus one data at time from time t6 by P/S data conversion circuit 80.

Accordingly, a precharge command can be accepted at time t8, and a new activate command can be executed from time t9 at the elapse of two clock cycles thereafter.

Thus, semiconductor memory device 1200 of the third embodiment is advantageous in that the possibility of a concurrent read operation and a write operation in the memory cell array is further reduced by combining the effect of avoiding collision of a write operation and a read operation by reading out or writing data of the burst length at one time in the memory cell array as in the first embodiment and the effect of avoiding collision of a write operation and a read operation by not writing the data directly into the memory cell array, but temporarily storing the same and then writing the same into the memory cell array, but at an appropriate timing. Accordingly, the usage efficiency of the data bus can be improved to transfer the read/write data at high speed even when the bandwidth is large.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of said data train as a first number, said semiconductor memory device further comprising:

an address input terminal receiving each bit of row address signal and column address signal to designate said memory cells of interest; and an internal column address generation circuit responsive to said column address signal and said burst length set signal to generate internal column address signals to select columns of said memory cells of said first number corresponding to said memory cells of interest respectively;

wherein said column selecting circuit renders said columns of memory cells of the first number active according to said internal column address signals, wherein said read data retaining circuit comprises:

read data latch circuits of said first number for storing each of said data signals of the first number, read switch circuits of said first number provided between said external data bus and respective read data latch circuits of said first number, and a count circuit sequentially turning on one of said read switch circuits of the first number.

2. The semiconductor memory device according to claim 1, wherein said control circuit further generates a clock signal, said first number being $2^M$ (M is an integer), wherein said count circuit counts up in synchronization with said clock signal to generate M count signals, and wherein each of said read switch circuits of the first number is turned on corresponding to a combination of a signal level of each of said M count signals.

3. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to variably set the burst length representing the number of data signals to $2^M$ (M is an integer not greater than N) in range of not more than $2^N$ (N is an integer), said semiconductor memory device further comprises:
an address input terminal receiving each bit of row address signal and column address signal to designate said memory cells of interest; and
an internal column address generation circuit responsive to said column address signal and said burst length set signal to generate internal column address signals to activate $2^M$ columns of memory cell array corresponding to said memory cells of interest respectively;
wherein said column selecting circuit activates said $2^M$ columns corresponding to said internal column address signals,
wherein said read data retaining circuit comprises
$2^N$ read data latch circuits for storing $2^N$ data signals,
$2^N$ read switch circuits provided between said external data bus and respective said $2^N$ read data latch circuits, and
a count circuit sequentially activating one of said $2^M$ read switch circuits selected in advance according to said burst length set signal out of said $2^N$ read switch circuits.

4. The semiconductor memory device according to claim 3, wherein said control circuit further generates a clock signal,
wherein said count circuit comprises
a first sub count circuit generating a count signal of N bits counted up in synchronization with said clock signal, and
a second sub count circuit forcing (N–M) bits of the count signal of said N bits to an inactive state and then providing the count signal of said N bits to each of said read switch circuits,
wherein each of said $2^N$ read switch circuits is turned on in response to a combination of a state of each bit of the count signal of said N bits.

5. A semiconductor memory device capable of inputting/outputting a plurality of data signals transmitted as a data train in time series by an external data bus in each of one read access operation and one write access operation, comprising:
a memory cell array including a plurality of memory cells arranged in a matrix;
a control circuit for generating a control command to carry out a read operation and a write operation with respect to said memory cell array;
a row selecting circuit and a column selecting circuit for selecting a plurality of memory cells of interest in said one read access operation and said one write access operation;
a write data retaining circuit for temporarily retaining said plurality of data signals transmitted from said external data bus, and then transmitting the data signals to said memory cell array in said write operation;
a read data retaining circuit for temporarily retaining said plurality of data signals output from said memory cell array to sequentially transmit the data signals to said external data bus in said read operation; and
an input/output selecting circuit responsive to said control command for transferring said plurality of data signals between each of the selected memory cells and said write and read data retaining circuits, wherein said control circuit generates a burst length set signal to define the burst length representing the number of data signals to L (L is a natural number), said semiconductor memory device further comprising:
an address input terminal receiving each bit of row address signal and column address signal to specify the plurality of select memory cells; and
an internal column address generation circuit generating internal column address signals to sequentially activate L columns of memory cell array corresponding to said memory cells of interest respectively according to said column address signal and said burst length set signal,
wherein said column selecting circuit sequentially activated said L columns according to said internal column address signals,
wherein said write data retaining circuit comprises
a write data storage circuit for temporarily storing L write data signals transmitted by said external data bus in said write operation,
a write address storing circuit for storing the column address signal corresponding to one of said L write data signals, and
a write control circuit for designating sequential transfer of said L write data signals into the selected memory cells from said write data storage circuit in response to said control command.

6. The semiconductor memory device according to claim 5, wherein said write control circuit activates a purge start signal designating initiation of transfer of said L write data signals and generates a purge count signal repeating activation and inactivation L times in response to said control command,
wherein said write data storage circuit includes L flip-flop circuits connected in series,
wherein a first one of said flip-flop circuits sequentially accepts one of said L write data signals transmitted through said external data bus in response to activation of said purge count signal,
wherein each of said L flip-flop circuits transfers one of said L write data signals in response to activation of said purge count signal,
wherein the Lth one of said flip-flop circuits transmits one of said L write data signals into said input/output selecting circuit.

7. The semiconductor memory device according to claim 6, wherein said write address storing circuit comprises
a write address memory circuit storing said column address signal corresponding to one of said L write data signals,
a first transfer gate responsive to activation of said purge start signal to transmit the column address signal stored in said write address memory circuit to said internal column address generation circuit, and
a second transfer gate responsive to inactivation of said purge start signal to transmit column address signal input from said address input terminal to said internal column address generation circuit.

8. The semiconductor memory device according to claim 6, wherein
said memory cell array includes a plurality of bit line pairs provided for columns of said memory cells respectively,
said control command includes
a write signal designating a write operation to said memory cell array, a read signal designating a readout operation to said memory cell array, a precharge signal designating a precharge operation to said bit line pairs, and a purge signal designating writing of said L write data signals retained in said write data storage circuit into the select memory cells, wherein said write control circuit renders said purge start signal active when at least one of said write signal, said precharge signal and said purge signal, and also a purge set signal are active, wherein said purge set signal is rendered active when said write signal is activated, and rendered inactive after at least one of said precharge signal and said purge signal is active in an inactive state of said write signal.

9. The semiconductor memory device according to claim 6, wherein said control command includes a write signal designating a write operation to said memory cell array, a read signal designating a readout operation to said memory cell array, and a purge signal designating writing of said L write data signals held in said write data storage circuit to the selected memory cells, wherein said control circuit renders said purge signal active after completion of said read operation or said write operation when said read signal or said write signal is active.

10. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of data signals to a first number, said semiconductor memory device comprising:

an address input terminal receiving each bit of row address signal and column address signal to designate said memory cells of interest; and an internal column address generation circuit responsive to said column address signal and said burst length set signal to generate internal column address signals to select columns of memory cells of said first number corresponding to said memory cells of interest respectively;

said column selecting circuit rendering said columns of memory cells of the first number active according to said internal column address signals, wherein said read data retaining circuit comprises read data latch circuits of the first number for storing each of data signals of the first number, read switch circuits of the first number, each read switch circuit being provided between respective read data latch circuit and said external data bus, and a readout count circuit sequentially turning on one of the read switch circuits of the first number, wherein said write data retaining circuit comprises a write data storage circuit for temporarily storing write data signals of the first number input in said write operation, and a write control circuit responsive to said control command for activating a purge start signal designating writing of write data signals of the first number into the plurality of select memory cells, wherein said write data storage circuit comprises first write data latch circuits of the first number for storing said write data signals of the first number, first write switch circuits of the first number, provided between respective first write data latch circuits of the first number and said external data bus, second write data latch circuits provided corresponding to said first write data latch circuits respectively, second write switch circuits of the first number provided between respective first write data latch circuits and said second write data latch circuits, and turned off when said purge start signal is rendered active, and a count circuit sequentially turning on one of said first write switch circuits of the first number, wherein said write data retaining circuit further comprises a write address storage circuit for temporarily storing storage column address which is the column address signal corresponding to one of the write data signals of the first number, and responsive to activation of said purge start signal to transmit said storage column addresses to said internal column address generation circuit.

11. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein, in response to a read command for said read access operation subsequent to write command for said write access operation, i) said input/output selecting circuit, controlled by said control circuit, reads out a plurality of read data signals associated with said read command from said memory cell array while a plurality of write data signals associated with said write command are transmitted to said write data retaining circuit, and ii) said input/output selecting circuit, controlled by said control circuit, writes said plurality of write data signals in said memory cell array after said plurality of read data signals are transmitted to said read data retaining circuit.

12. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said plurality of data signals retained by said write data retaining circuit are written in said memory cell array in response to a purge command.

13. The semiconductor memory device according to claim 12, wherein said purge command includes an auto purge command.

14. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of data signals to a first number, said semiconductor memory device comprising:

an address input terminal receiving each bit of row address signal and column address signal to designate said memory cells of interest; and an internal column address generation circuit responsive to said column address signal and said burst length set signal to generate internal column address signals to select columns of memory cells of said first number corresponding to said memory cells of interest respectively;

said column selecting circuit rendering said columns of memory cells of the first number active according to said internal column address signals, wherein said write data retaining circuit comprises a write data storage circuit for temporarily storing write data signals of the first number input in said write operation, and a write control circuit responsive to said control command for activating a purge start signal designating writing of write data signals of the first number into the plurality of select memory cells, wherein said write data storage circuit comprises first write data latch circuits of the first number for storing said write data signals of the first number, first write switch circuits of the first number, provided between respective first write data latch circuits of the first number and said external data bus, second write data latch circuits provided corresponding to said first write data latch circuits respectively, second write switch circuits of the first number provided between respective first write data latch circuits and said second write data latch circuits, and turned off when said purge start signal is rendered active, and a count circuit sequentially turning on one of said first write switch circuits of the first number, wherein said write data retaining circuit further comprises a write address storage circuit for temporarily storing storage column address which is the column address signal corresponding to one of the write data signals of the first number, and responsive to activation of said purge start signal to transmit said storage column addresses to said internal column address generation circuit.

15. The semiconductor memory device according to claim 5, wherein said internal column address generation circuit generates said internal column address signals according to the column address signal stored in said write address storing circuit when said write control circuit designates said sequential transfer.

16. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals in parallel to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of said data train as a first number, said semiconductor memory device further comprising:

an address input terminal receiving each bit of row address signal and column address signal to designate said memory cells of interest; and an internal column generation circuit responsive to said column address signal and said burst length set signal to generate internal column address signals to select columns of said memory cells of said first number corresponding to said memory cells of interest respectively, wherein said column selecting circuit renders said columns of memory cells of the first number active according to said internal column address signals, wherein said read data retaining circuit comprises read data latch circuits of said first number for storing each of said data signals of the first number, read switch circuits of said first number provided between said external data bus and respective read data latch circuits of said first number, and a count circuit sequentially turning on one of said read switch circuits of the first number.

17. The semiconductor memory device according to claim 16, wherein said control circuit further generates a clock signal, said first number being $2^M$ (M is an integer), wherein said count circuit counts up in synchronization with said clock signal to generate M count signals, and wherein each of said read switch circuits of the first number is turned on corresponding to a combination of a signal level of each of said M count signals.

18. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals in parallel to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to variably set the burst length representing the number of data signals to $2^M$ (M is an integer not greater than N) in a range of not more than $2^N$ (N is an integer), said semiconductor memory device further comprising:

an address input terminal receiving each bit of row address signal and column address signal to designate said memory cells of interest; and an internal column address generation circuit responsive to said column address signal and said burst length set signal to generate internal column address signals to activate $2^M$ columns of memory cell array corresponding to said memory cells of interest respectively;

wherein said column selecting circuit activates said $2^M$ columns corresponding to said internal column address signals, wherein said read data retaining circuit comprises $2^N$ read data latch circuits for storing $2^N$ data signals, $2^N$ read switch circuits provided between said external data bus and respective said $2^N$ read data latch circuits, and a count circuit sequentially activating one of said $2^M$ read switch circuits selected in advance according to said burst length set signal out of said $2^N$ read switch circuits.

19. The semiconductor memory device according to claim 18, wherein said control circuit further generates a clock signal, wherein said count circuit comprises a first sub count circuit generating a count signal of N bits counted up in synchronization with said clock signal, and a second sub count circuit forcing (N–M) bits of the count signal of said N bits to an inactive state and then providing the count signal of said N bits to each of said read switch circuits, wherein each of said $2^N$ read switch circuits is turned on in response to a combination of a state of each bit of the count signal of said N bits.

20. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals in parallel to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define the burst length representing the number of data signals to L (L is a natural number), said semiconductor memory device further comprising:
  an address input terminal receiving each bit of row address signal and column address signal to specify the plurality of select memory cells; and
  an internal column address generation circuit generating internal column address signals to sequentially activate L columns of memory cell array corresponding to said memory cells of interest respectively according to said column address signal and said burst length set signal,
  wherein said column selecting circuit sequentially activates said L columns according to said internal column address signals,
wherein said write data retaining circuit comprises:
  a write data storage circuit for temporarily storing L write data signals transmitted by said external data bus in said write operation,
  a write address storing circuit for storing the column address signal corresponding to one of said L write data signals, and
  a write control circuit for designating sequential transfer of said L write data signals into the selected memory cells from said write data storage circuit in response to said control command.

21. The semiconductor memory device according to claim 20, wherein said write control circuit activates a purge start signal designating initiation of transfer of said L write data signals and generates a purge count signal repeating activation and inactivation L times in response to said control command,
  wherein said write data storage circuit includes L flip-flop circuits connected in series,
  wherein a first one of said flip-flop circuits sequentially accepts one of said L write data signals transmitted through said external data bus in response to activation of said purge count signal,
  wherein each of said L flip-flop circuits transfers one of said L write data signals in response to activation of said purge count signal,
  wherein the Lth one of said flip-flop circuits transmits one of said L write data signals into said input/output selecting circuit.

22. The semiconductor memory device according to claim 21, wherein said write address storing circuit comprises:
  a write address memory circuit storing said column address signal corresponding to one of said L write data signals,
  a first transfer gate responsive to activation of said purge start signal to transmit the column address signal stored in said write address memory circuit to said internal column address generation circuit, and
  a second transfer gate responsive to inactivation of said purge start signal to transmit column address signal input from said address input terminal to said internal column address generation circuit.

23. The semiconductor memory device according to claim 21, wherein
  said memory cell array includes a plurality of bit line pairs provided for columns of said memory cells respectively,
  said control command includes
  a write signal designating a write operation to said memory cell array,
  a read signal designating a readout operation to said memory cell array,
  a precharge signal designating a precharge operation to said bit line pairs, and
  a purge signal designating writing of said L write data signals retained in said write data storage circuit into select memory cells,
  wherein said write control circuit renders said purge start signal active when at least one of said write signal, said precharge signal and said purge signal, and also a purge set signal are active,
  wherein said purge set signal is rendered active when said write signal is activated, and rendered inactive after at least one of said precharge signal and said purge signal is active in an inactive state of said write signal.

24. The semiconductor memory device according to claim 21, wherein said control command includes
  a write signal designating a write operation to said memory cell array,
  a read signal designating a readout operation to said memory cell array, and
  a purge signal designating writing of said L write data signals held in said write data storage circuit to the selected memory cells,
  wherein said control circuit renders said purge signal active after completion of said read operation or said write operation when said read signal or said write signal is active.

25. A semiconductor memory device capable of inputting/outputting a plurality of data signals transmitted as a data train in time series by an external data bus in each of one read access operation and one write access operation, comprising:
  a memory cell array including a plurality of memory cells arranged in a matrix;
  a control circuit for generating a control command to carry out a read operation and a write operation with respect to said memory cell array;
  a row selecting circuit and a column selecting circuit for selecting a plurality of memory cells of interest in said one read access operation and said one write access operation;
  a write data retaining circuit for temporarily retaining said plurality of data signals transmitted from said external data bus, and then transmitting the data signals in parallel to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of data signals to a first number, said semiconductor memory device comprising:
   an address input terminal receiving each bit of row address signal and column address signal to designate said memory cells of interest; and
   an internal column address generation circuit responsive to said column address signal and said burst length set signal to generate internal column address signals to select columns of memory cells of said first number corresponding to said memory cells of interest respectively;
   said column selecting circuit rendering said columns of memory cells of the first number active according to said internal column address signals, wherein said read data retaining circuit comprises
   read data latch circuits of the first number for storing each of data signals of the first number,
   read switch circuits of the first number, each read switch circuit being provided between respective read data latch circuit and said external data bus, and
   a readout count circuit sequentially turning on one of the read switch circuits of the first number, wherein said write data retaining circuit comprises:
   a write data storage circuit for temporarily storing write data signals of the first number input in said write operation, and
   a write control circuit responsive to said control command for activating a purge start signal designating writing of write data signals of the first number into the plurality of select memory cells, wherein said write data storage circuit comprises
   first write data latch circuits of the first number for storing said write data signals of the first number,
   first write switch circuits of the first number, provided between respective first write data latch circuits of the first number and said external data bus,
   second write data latch circuits provided corresponding to said first write data latch circuits respectively,
   second write switch circuits of the first number provided between respective first write data latch circuits and said second write data latch circuits, and turned off when said purge start signal is rendered active, and
   a count circuit sequentially turning on one of said first write switch circuits of the first number, wherein said write data retaining circuit further comprises a write address storage circuit for temporarily storing a storage column address which is the column address signal corresponding to one of the write data signals of the first number, and responsive to activation of said purge start signal to transmit said storage column addresses to said internal column address generation circuit.

26. A semiconductor memory device capable of inputting/outputting a plurality of data signals transmitted as a data train in time series by an external data bus in each of one read access operation and one write access operation, comprising:
   a memory cell array including a plurality of memory cells arranged in a matrix;
   a control circuit for generating a control command to carry out a read operation and a write operation with respect to said memory cell array;
   a row selecting circuit and a column selecting circuit for selecting a plurality of memory cells of interest in said one read access operation and said one write access operation;
   a write data retaining circuit for temporarily retaining said plurality of data signals transmitted from said external data bus, and then transmitting the data signals in parallel to said memory cell array in said write operation;
   a read data retaining circuit for temporarily retaining said plurality of data signals output from said memory cell array to sequentially transmit the data signals to said external data bus in said read operation; and
   an input/output selecting circuit responsive to said control command for transferring said plurality of data signals between each of the selected memory cells and said write and read data retaining circuits,
   wherein, in response to a read command for said read access operation subsequent to write command for said write access operation,
     i) said input/output selecting circuit, controlled by said control circuit, reads out a plurality of read data signals associated with said read command from said memory cell array while a plurality of write data signals associated with said write command are transmitted to said write data retaining circuit, and
     ii) said input/output selecting circuit, controlled by said control circuit, writes said plurality of write data signals in said memory cell array after said plurality of read data signals are transmitted to said read data retaining circuit.

27. A semiconductor memory device capable of inputting/outputting a plurality of data signals transmitted as a data train in time series by an external data bus in each of one read access operation and one write access operation, comprising:
   a memory cell array including a plurality of memory cells arranged in a matrix;
   a control circuit for generating a control command to carry out a read operation and a write operation with respect to said memory cell array;
   a row selecting circuit and a column selecting circuit for selecting a plurality of memory cells of interest in said one read access operation and said one write access operation;
   a write data retaining circuit for temporarily retaining said plurality of data signals transmitted from said external data bus, and then transmitting the data signals in parallel to said memory cell array in said write operation;
   a read data retaining circuit for temporarily retaining said plurality of data signals output from said memory cell array to sequentially transmit the data signals to said external data bus in said read operation; and
   an input/output selecting circuit responsive to said control command for transferring said plurality of data signals between each of the selected memory cells and said write and read data retaining circuits, wherein said plurality of data signals retained by said write data retaining circuit are written in said memory cell array in response to a purge command.

28. The semiconductor memory device according to claim 27, wherein said purge command includes an auto purge command.

29. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest in said one read access operation and said one write access operation;

a write data retaining circuit for temporarily retaining said plurality of data signals transmitted from said external data bus, and then transmitting the data signals in parallel to said memory cell array in said write operation;

a read data retaining circuit for temporarily retaining said plurality of data signals output from said memory cell array to sequentially transmit the data signals to said external data bus in said read operation; and an input/output selecting circuit responsive to said control command for transferring said plurality of data signals between each of the selected memory cells and said write and read data retaining circuits, wherein said control circuit generates a burst length set signal to define a burst length representing the number of data signals to a first number, said semiconductor memory device comprising:

an address input terminal receiving each bit of row address signal and column address signal to designate said memory cells of interest; and an internal column address generation circuit responsive to said column address signal and said burst length set signal to generate internal column address signals to select columns of memory cells of said first number corresponding to said memory cells of interest respectively;

said column selecting circuit rendering said columns of memory cells of the first number active according to said internal column address signals, wherein said write data retaining circuit comprises a write data storage circuit for temporarily storing write data signals of the first number input in said write operation, and a write control circuit responsive to said control command for activating a purge start signal designating writing of write data signals of the first number into the plurality of select memory cells, wherein said write data retaining circuit comprises first write data latch circuits of the first number for storing said write data signals of the first number, first write switch circuits of the first number, provided between respective first write data latch circuits of the first number and said external data bus, second write data latch circuits provided corresponding to said first write data latch circuits respectively, second write switch circuits of the first number provided between respective first write data latch circuits and said second write data latch circuits, and turned off when said purge start signal is rendered active, and a count circuit sequentially turning on one of said first write switch circuits of the first number, wherein said write data retaining circuit further comprises a write address storage circuit for temporarily storing storage column address which is the column address signal corresponding to one of the write data signals of the first number, and responsive to activation of said purge start signal to transmit said storage column addresses to said internal column address generation circuit.

30. The semiconductor memory device according to claim 20, wherein said internal column address generation circuit generates said internal column address signals according to the column address signal stored in said write address storing circuit when said write control circuit designates said sequential transfer.

31. A semiconductor memory device capable of inputting/outputting a plurality of data signals transmitted as a data train in time series by an external data bus in each of one read access operation and one write access operation, comprising:

a memory cell array including a plurality of memory cells arranged in a matrix;

a control circuit for generating a control command to carry out a read operation and a write operation with respect to said memory cell array;

a row selecting circuit and a column selecting circuit for selecting a plurality of memory cells of interest for a period of time including one of said one read access operation and said one write access operation;

a write data retaining circuit for temporarily retaining said plurality of data signals transmitted from said external data bus, and then transmitting the data signals to said memory cell array in said operation;

a read data retaining circuit for temporarily retaining said plurality of data signals output from said memory cell array to sequentially transmit the data signals to said external data bus in said read operations; and an input/output selecting circuit responsive to said control command for transferring said plurality of data signals between each of the selected memory cells and said write and read data retaining circuits.

32. The semiconductor memory device according to claim 31, wherein, in response to a read command for said read access operation subsequent to write command for said write access operation, i) said input/output selecting circuit, controlled by said control circuit, reads out a plurality of read data signals associated with said read command from said memory cell array while a plurality of write data signals associated with said write command are transmitted to said write data retaining circuit, and ii) said input/output selecting circuit, controlled by said control circuit, writes said plurality of write data signals in said memory cell array after said plurality of read data signals are transmitted to said read data retaining circuit.

33. The semiconductor memory device according to claim 31, wherein said plurality of data signals retained by said write retaining circuit are written in said memory cell array in response to a purge command.

34. The semiconductor memory device according to claim 33, wherein said purge command includes an auto purge command.

35. A semiconductor memory device capable of inputting/outputting a plurality of data signals transmitted as a data train in time series by an external data bus in each of one read access operation and one write access operation, comprising:

- a memory cell array including a plurality of memory cells arranged in a matrix;
- a control circuit for generating a control command to carry out a read operation and a write operation with respect to said memory cell array;
- a row selecting circuit and a column selecting circuit for selecting a plurality of memory cells of interest for a period of time including one of said one read access operation and said one write access operation;
- a write data retaining circuit for temporarily retaining said plurality of data signals transmitted from said external data bus, and then transmitting the data signals in parallel to said memory cell array in said write operation;
- a read data retaining circuit for temporarily retaining said plurality of data signals output from said memory cell array to sequentially transmit the data signals to said external data bus in said read operation; and
- an input/output selecting circuit responsive to said control command for transferring said plurality of data signals between each of the selected memory cells and said write and read data retaining circuits.

36. The semiconductor memory device according to claim 35, wherein said plurality of data signals retained by said write data retaining circuit are written in said memory cell array in response to a purge command.

37. The semiconductor memory device according to claim 36, wherein said purge command includes an auto purge command.

* * * * *